US006809661B1

(12) United States Patent
Badarneh

(10) Patent No.: US 6,809,661 B1
(45) Date of Patent: Oct. 26, 2004

(54) KEYPAD DEVICE

(75) Inventor: Ziad Badarneh, Oslo (NO)

(73) Assignee: Telenostra AS, Oslo (NO)

( * ) Notice: Subject to any disclaimer, the term of this patent is extended or adjusted under 35 U.S.C. 154(b) by 0 days.

(21) Appl. No.: 09/856,031

(22) PCT Filed: Dec. 8, 1999

(86) PCT No.: PCT/NO99/00373

§ 371 (c)(1),
(2), (4) Date: May 16, 2001

(87) PCT Pub. No.: WO00/34965

PCT Pub. Date: Jun. 15, 2000

(30) Foreign Application Priority Data

Dec. 9, 1998 (NO) ............................................. 985770
Jul. 23, 1999 (NO) ............................................. 993598
Sep. 28, 1999 (NO) ............................................. 994723

(51) Int. Cl.[7] ............................................. H03M 11/00

(52) U.S. Cl. ........................... 341/31; 341/20; 345/161; 345/166; 200/61.02; 385/16; 385/18; 250/229; 250/578.1

(58) Field of Search ............................. 341/20, 27, 31; 345/166, 161, 165; 200/DIG. 47, DIG. 36, 61.02; 385/18; 250/16, 221, 229, 231.13, 578.1; 145/166

(56) References Cited

U.S. PATENT DOCUMENTS 4,250,378 A * 2/1981 Mutton ........................ 250/221
4,584,510 A * 4/1986 Hollow ........................ 318/584
4,816,671 A * 3/1989 Umemura .................... 250/229
4,994,669 A * 2/1991 Stern ........................... 250/229
5,065,146 A * 11/1991 Garrett ........................ 345/161
5,355,148 A * 10/1994 Anderson ................... 345/166
5,471,054 A * 11/1995 Watanabe .............. 250/231.13

* cited by examiner

*Primary Examiner*—Albert K. Wong
(74) *Attorney, Agent, or Firm*—Rodman & Rodman

(57) ABSTRACT

A keypad device for telephones, mobile phones, remote control units, text and character transmitters, calculators, electronic planners or the like, wherein a control element, when actuated manually by an operator, is adapted to be able to carry out at least two function commands, and preferably wherein the movement of the control element can be felt manually, or optionally is indicated by sound and/or light. The device consists of an apparatus housing in which a control wheel is pivotally mounted, wherein the control wheel in a sprung manner is supported and mounted at least at three portions thereof; a fixing bracket device which is rotationally stationary in the apparatus housing, but tiltable relative to the housing, the fixing bracket device being pivotally connected to the control wheel and provided with at least two pins extending into slots in the housing, whereby the rotational motion of the fixing bracket device is prevented and its tilting motion is limited; at least one detector for detecting the rotational motion of the control wheel, the control wheel either on its underside or its periphery being provided with optical markings and said detector being positioned opposite said markings; and either at least one light emitter/light receiver set positioned at a distance from the underside of the control wheel and which, upon downward tilting of the control wheel at the location of the light emitter/light receiver set in the apparatus housing, actuates the path of the light beam between the light emitter and light receiver; or at least one tilt detector, e.g., a microswitch, positioned at a distance from the underside of the control wheel and which, upon downward tilting of the control wheel at the location of the tilt detector in the apparatus housing, actuates the tilt detector.

33 Claims, 31 Drawing Sheets

Fig.45.
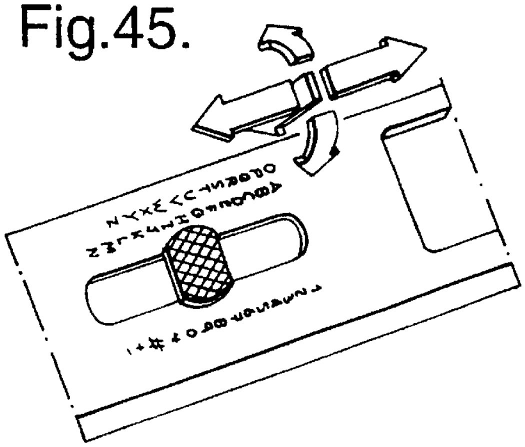
Fig.46.
| | | |
|---|---|---|
| O | A | 1 |
| P | B | 2 |
| Q | C | 3 |
| R | D | 4 |
| S | E | 5 |
| T | F | 6 |
| U | G | 7 |
| V | H | 8 |
| W | I | 9 |
| X | J | 0 |
| Y | K | * |
| Z | L | # |
| | M | + |
| | N | – |
Fig.47.
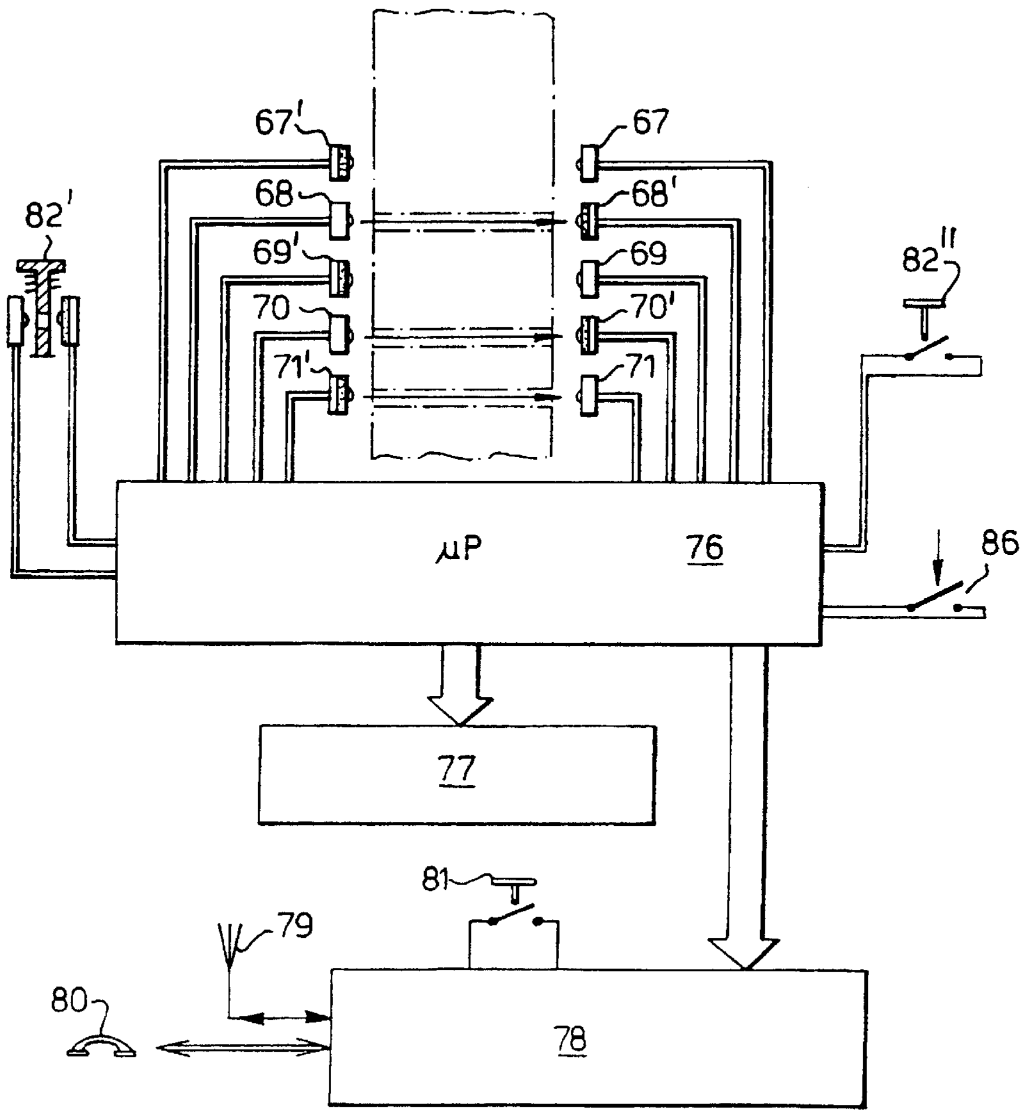

| Turning A | CW B |
|---|---|
| 0 | 0 |
| 0 | 1 |
| 1 | 1 |
| 1 | 0 |
| 0 | 0 |

| Turning A | CCW B |
|---|---|
| 0 | 0 |
| 1 | 0 |
| 1 | 1 |
| 0 | 1 |
| 0 | 0 |

| C | D | |
|---|---|---|
| 1 | 1 | No action |
| 0 | 1 | Push down at 193 |
| 1 | 0 | Push down at 194 |
| 0 | 0 | Push down at 199 |

| Turning | CW |
|---|---|
| A | B |
| 0 | 0 |
| 0 | 1 |
| 1 | 1 |
| 1 | 0 |
| 0 | 0 |

| Turning | CCW |
|---|---|
| A | B |
| 0 | 0 |
| 1 | 0 |
| 1 | 1 |
| 0 | 1 |
| 0 | 0 |

Fig.104.
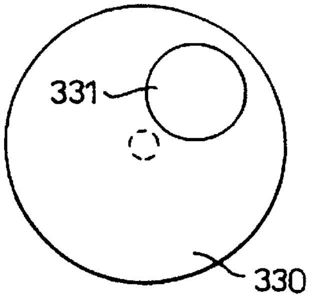
Fig.105.
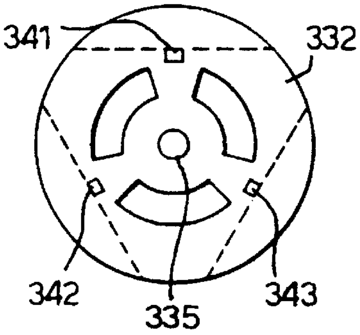
Fig.106.
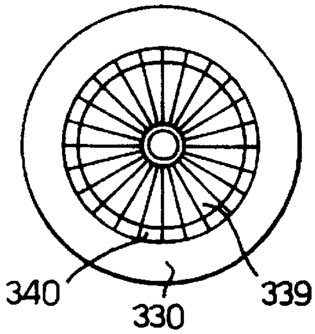
Fig.107.
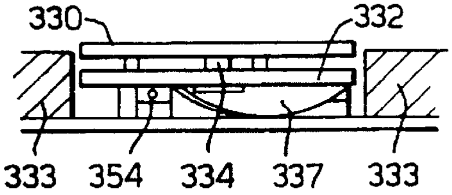
Fig.108.
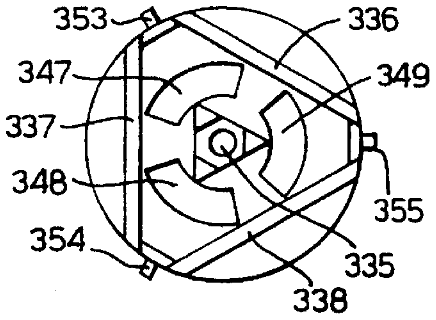
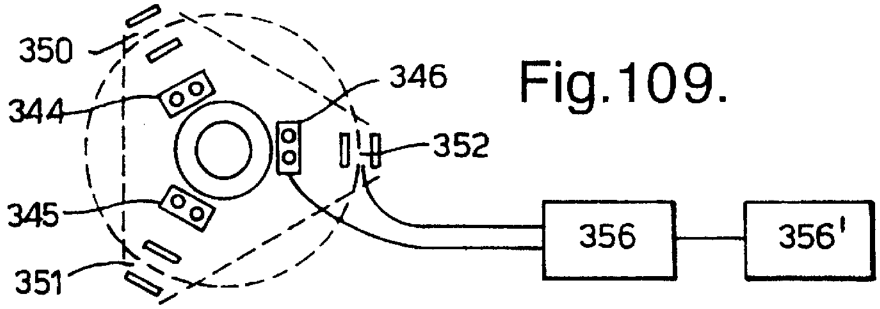
Fig.109.
Fig.110.
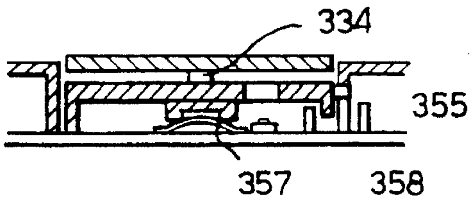
Fig.111.
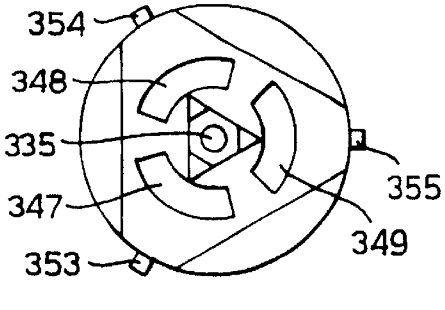

KEYPAD DEVICE

The present invention relates to a keypad device for telephones, mobile phones, remote control units, text and character transmitters, calculators, electronic planners or the like, wherein a control element, when actuated manually by an operator's finger, is adapted to carry out at least two function commands, and wherein various positions of the control element are identified by means of optical detectors.

The use of a plurality of keys or multifunction keys is previously known, inter alia, in connection with mobile telephones. These keys are operated by the user depressing them. As a rule, these known function keys are connected to microswitches, and there is thus only a limited number of functions that are possible with one and the same key without rendering the functionality complex and difficult to use. It is also known that microswitches have as a rule an imprecise activation characteristic. Today's mobile phones contain a profusion of functions in addition to ordinary telephone functions and they are equipped with a memory like that in small computers. This allows a user to compile information, e.g., telephone number and address lists. The further development has tended towards mobile phones which are built up as complete communicators for text, video and voice by using, for example, the Internet which is normally used on a PC. A new format for this is called WAP and it is a standard for Internet services for GSM telephones. All these new services and functions will require simpler, logical and efficient methods of operation and navigation as a standard button keypad. Obviously, a standard button keypad will require a very great number of buttons in order to be able to serve so many functions, and as a result will at the same time become difficult or awkward to use, and not least bulky. With the ever-increasing tendency towards miniaturisation there have been limitations, particularly in connection with mobile phones, with respect to how small function keys can be made without creating problems as regards the operation of the keypad.

U.S. Pat. No. 4,994,669 discloses a device of the joystick type in which the various positions thereof are identified by means of a set of light emitters and light receivers, the control element of the device being of a type that can not be depressed.

The object of the present invention is thus to provide a device wherein at least two, but preferably a great number and range of functions can be effected using one and the same key, where the user can use the device for different apparatuses, preferably mobile phones, in a simple, logical and reliable manner, in order to operate effectively through functions and menus, whilst during simple operations, such as using a mobile phone (e.g., dialling a number), not being dependent upon monitoring the device visually. Consequently, it is also an object of the invention to enhance the MMI, i.e., Man-Machine Interface.

The characterising features of the device according to the preferred embodiments are set forth in the characterising clauses of attached claims 1, 6, 13, 14, 15, 45, 53, 54, 60, 61, 67, 69, 72, 74, and 76, and the appurtenant subclaims.

The invention will now be described in more detail with reference to the attached drawings.

FIGS. 38–47 show a third embodiment of the device according to the invention.

FIGS. 104–115 show a thirteenth embodiment of the device according to the invention.

Figure 1:
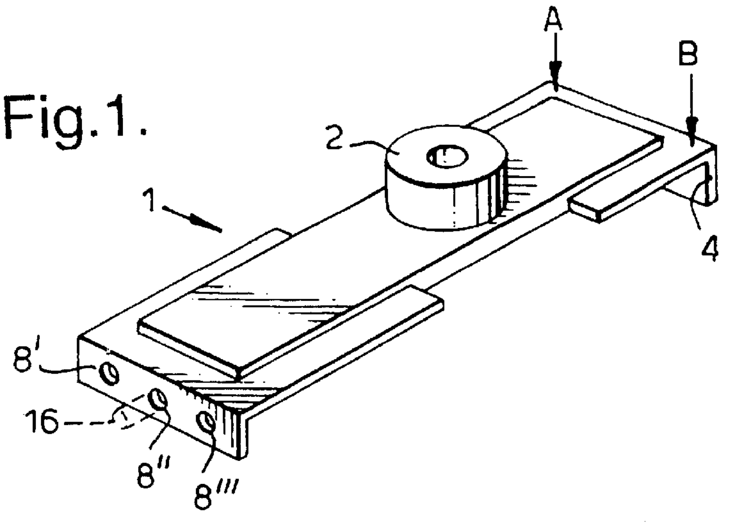
FIGS. 1–10 show an example of a first embodiment of the device according to the invention.
Figure 2:
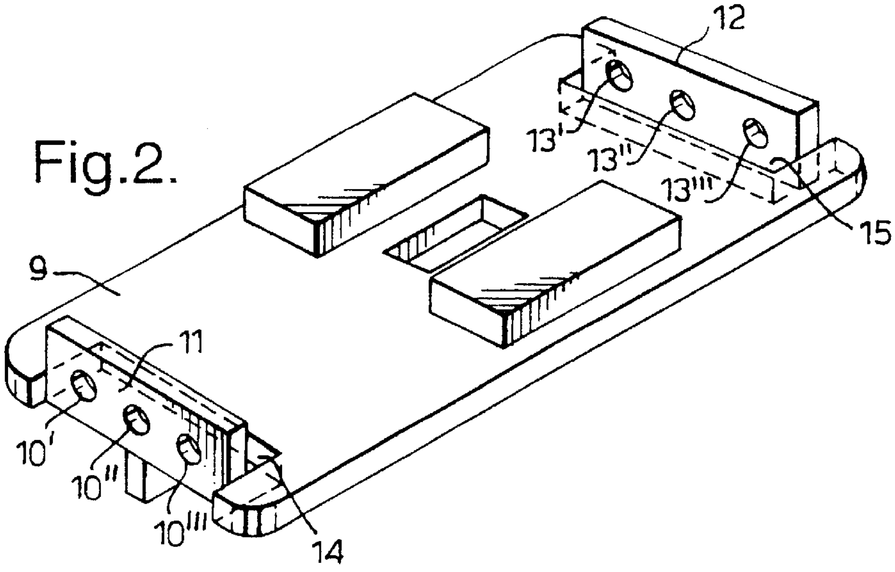
Figure 3:
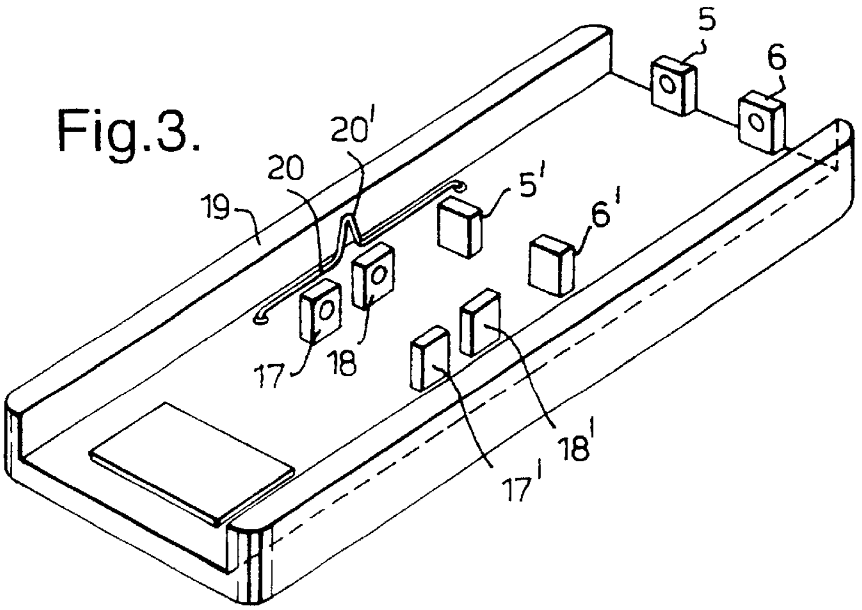

More specifically, FIGS. 1, 2 and 3 show a key top member, a slide member and a key base member respectively.

Figure 4:
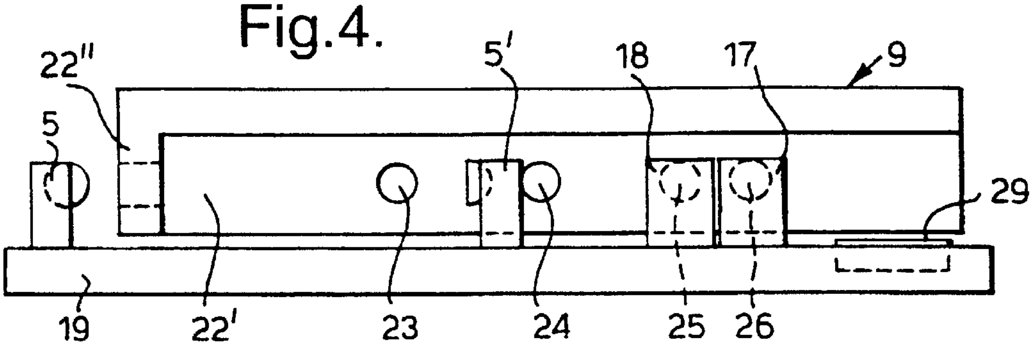

FIG. 4 is a side view, with some portions of the key base member cut away, of the typical interaction between the slide member and the key base member.

Figure 5:
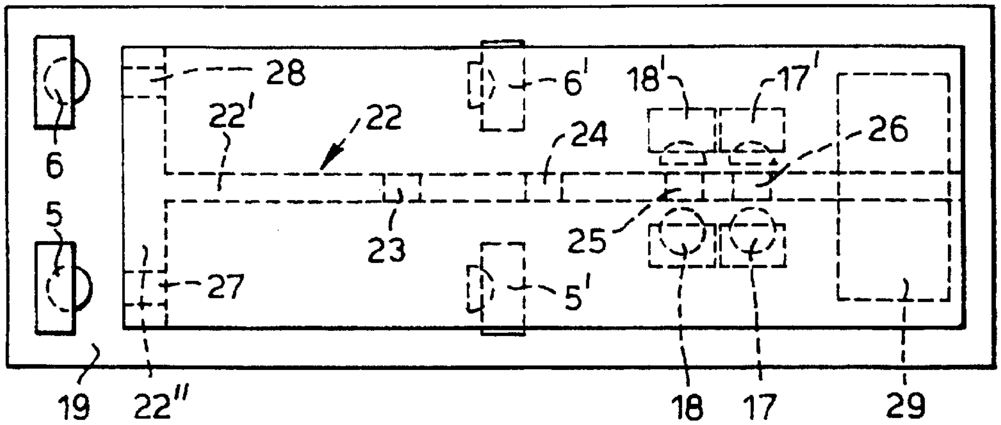

FIG. 5 shows the assembly of FIG. 4 from above.

Figure 6:
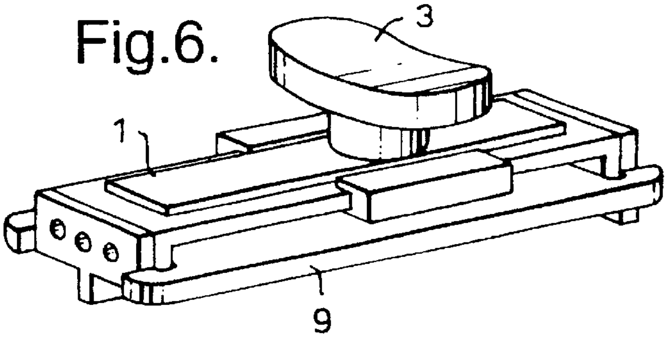
Figure 7:
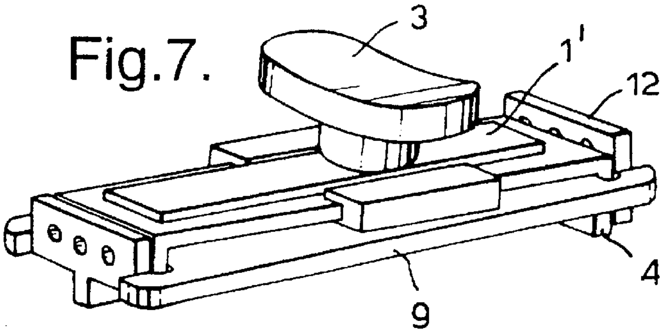
Figure 8:
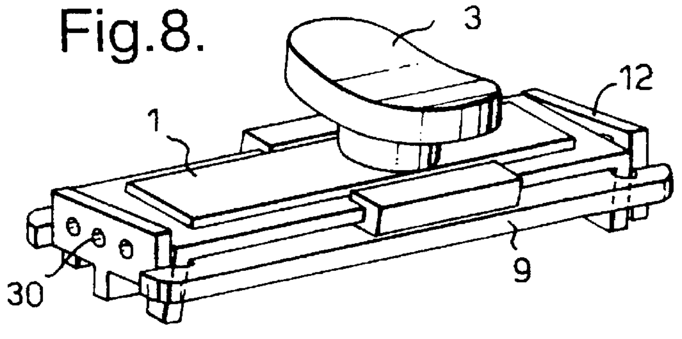

FIGS. 6, 7 and 8 show an assembled top member and slide member in a neutral position, a first activated position and a second activated position respectively.

Figure 9:
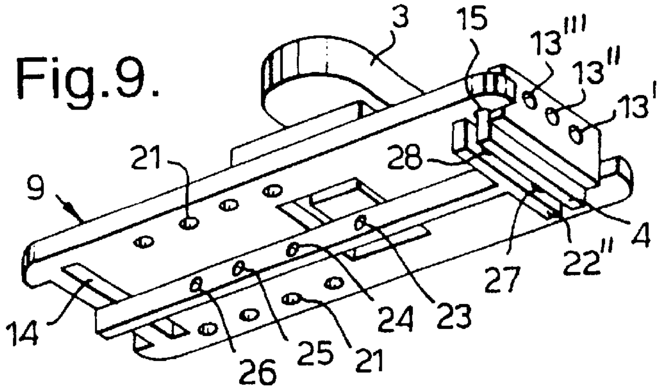

FIG. 9 shows the assembly of FIGS. 6, 7 and 8 seen from the underside and in perspective.

Figure 10:
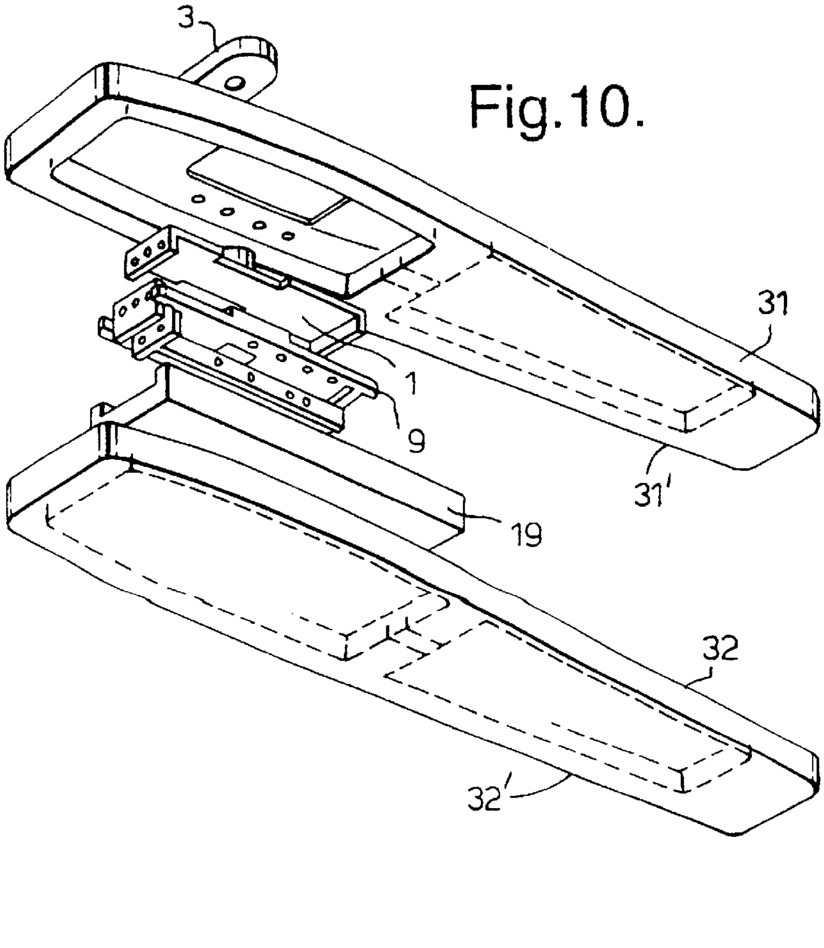

FIG. 10 is an exploded view of the device shown in FIGS. 1–9 in connection with a housing in which the device can be mounted.

Figure 11:
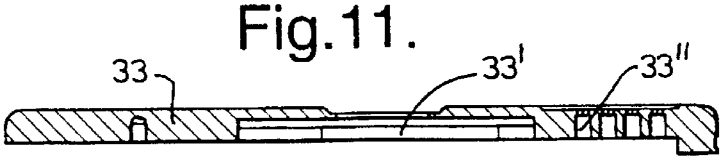
FIGS. 11–37 show by way of an example a second typical embodiment of the device according to the invention, wherein this embodiment is to be understood as a variant of the embodiment in FIGS. 1–10.
Figure 12:

FIGS. 11 and 12 show a longitudinal cross-section of respectively the top and bottom of a typical housing in which the device according to the invention can be mounted.

Figure 13:
Figure 14:

FIGS. 13 and 14 are end views of the top and bottom respectively.

Figure 15:
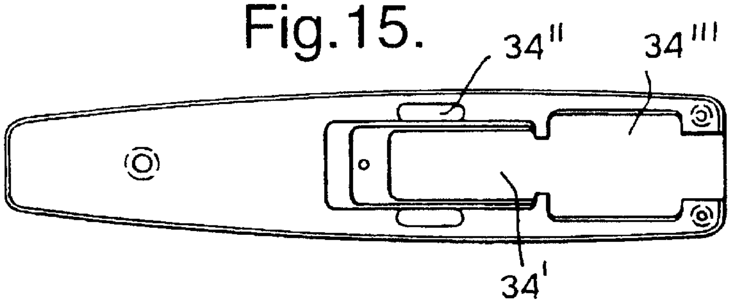

FIG. 15 is a top view of the bottom.

Figure 16:
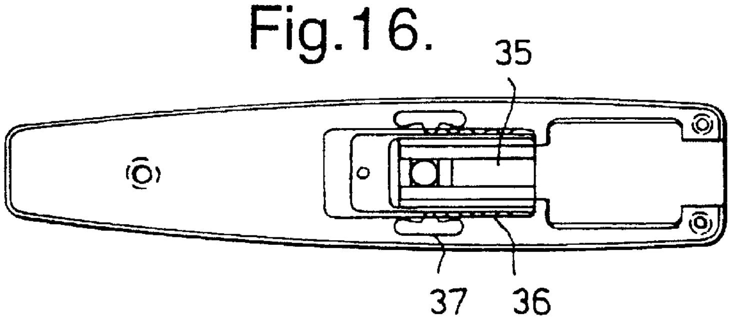

FIG. 16 is a top view of the bottom with a slide element mounted therein.

Figure 17:
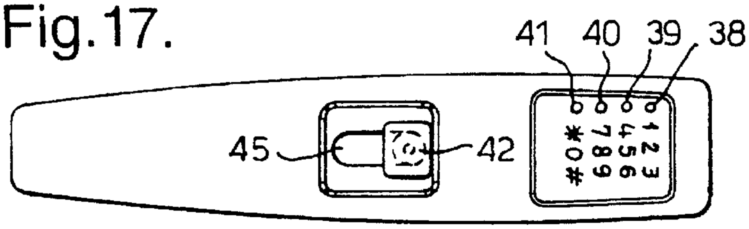

FIG. 17 shows the top seen from above the slide element and the slide element position indicator.

Figure 18:
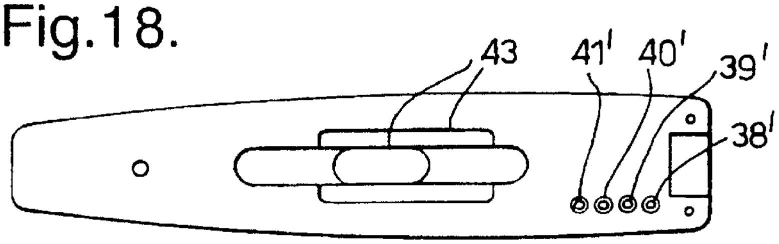

FIG. 18 shows the top seen from the underside.

Figure 19:
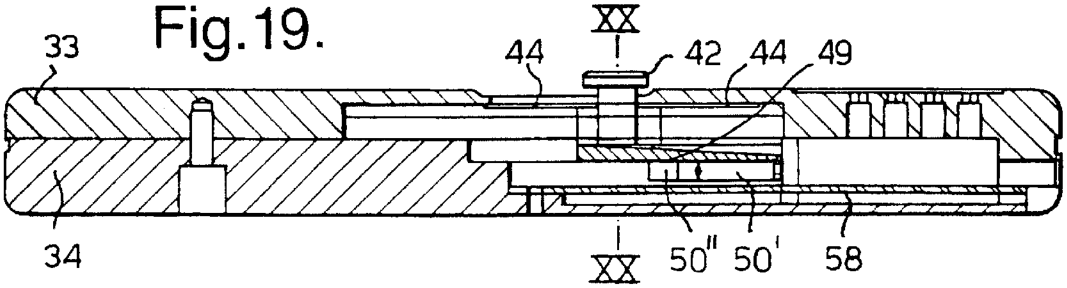

FIG. 19 shows the housing as indicated in FIGS. 11 and 12 and the slide element mounted therein.

Figure 20:
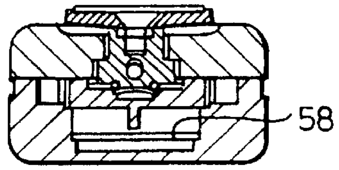

FIG. 20 shows the section taken along the line XX—XX in FIG. 19.

Figure 21:
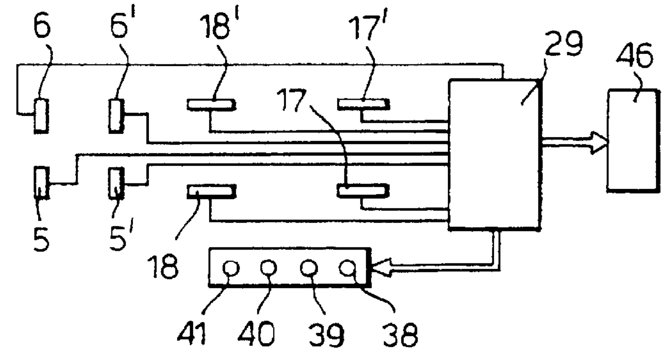

FIG. 21 shows a simplified circuit diagram which should be examined in more detail in connection with FIGS. 26–38.

Figure 22:
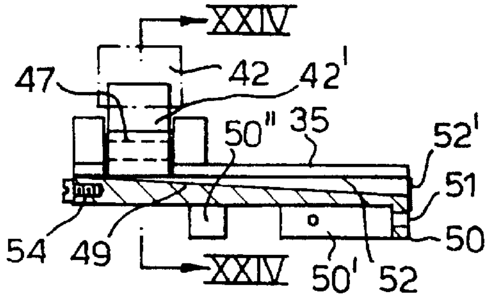

FIG. 22 shows a longitudinal cross-section through the slide element as shown on a smaller scale in FIG. 19.

Figure 23:
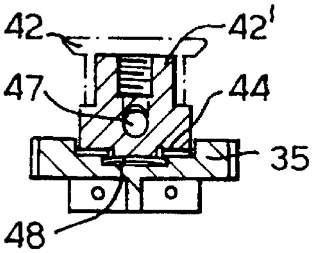

FIG. 23 shows the section taken along the line XXIV—XXIV in FIG. 22.

Figure 24:
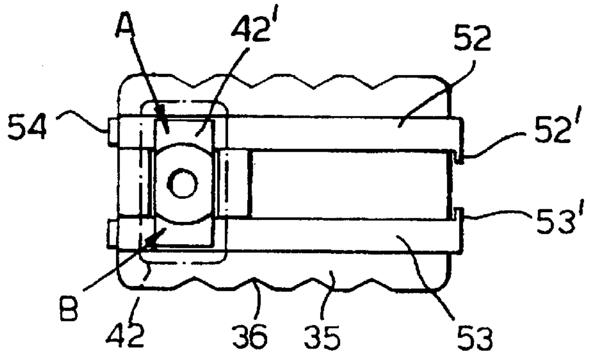

FIG. 24 shows the slide member in FIG. 22 seen from above.

Figure 25:
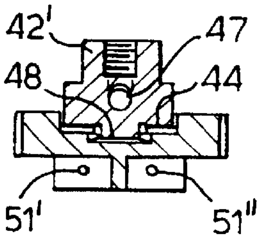
Figure 26:
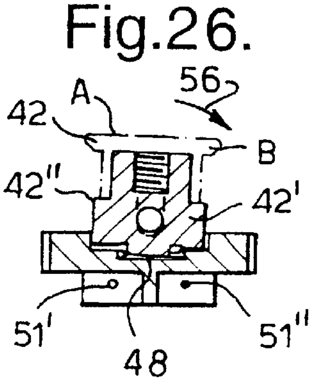
Figure 27:
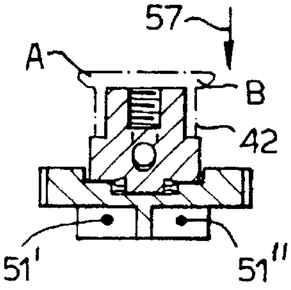

FIGS. 25, 26 and 27 show the control button on the slide member in a neutral position, a tilted position to one of the sides (tilting to the other side is also possible) and a depressed position, respectively.

Figure 28:
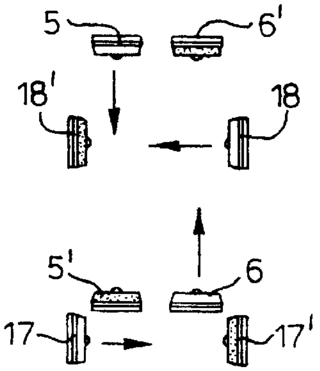

FIG. 28 shows a typical array of light emitters and light receivers for detecting the movements of the slide member which should by no means be understood as defining the limits of the invention.

Figure 29:
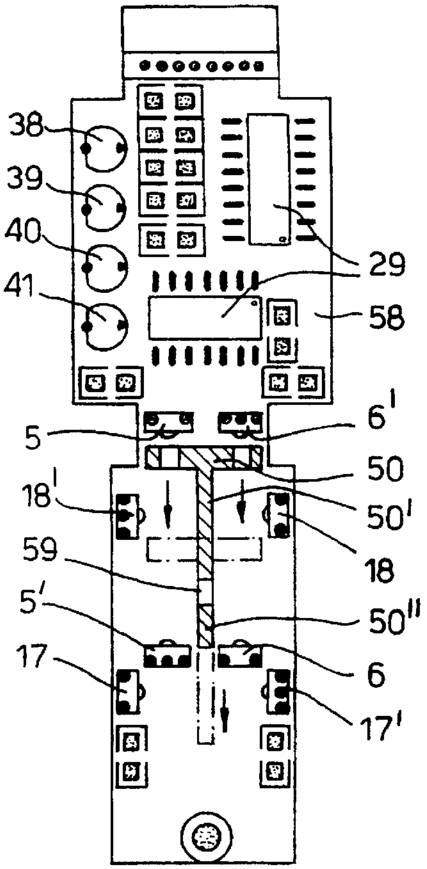

FIG. 29 shows the array of light emitters and light receivers in an embodiment of the circuit board which should by no means be understood as defining the limits of the invention.

FIGS. 30–33 show detection possibilities in different positions of the slide member control button.

FIGS. 34–37 show different registration possibilities on longitudinal movement of the slide member relative to the base member of the device or circuit board as shown in FIG. 29.

Figure 38:
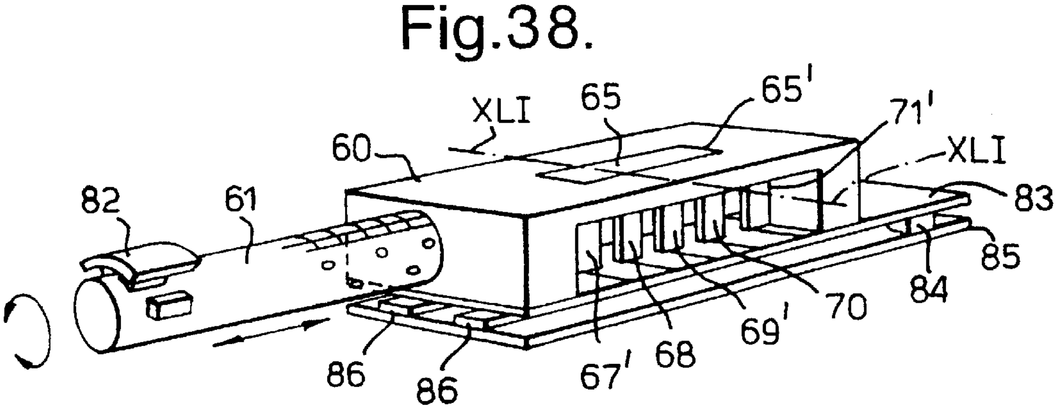

FIG. 38 is a perspective view of the device with a detector unit and a code bar capable of displacement therethrough.

Figure 39:
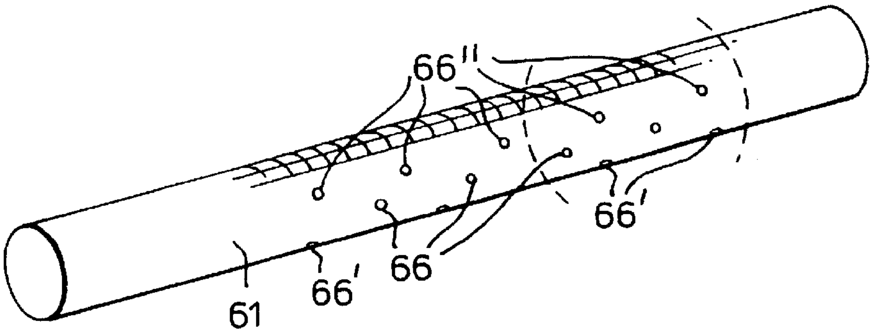

FIG. 39 shows an example of a code bar of this type.

Figure 40:
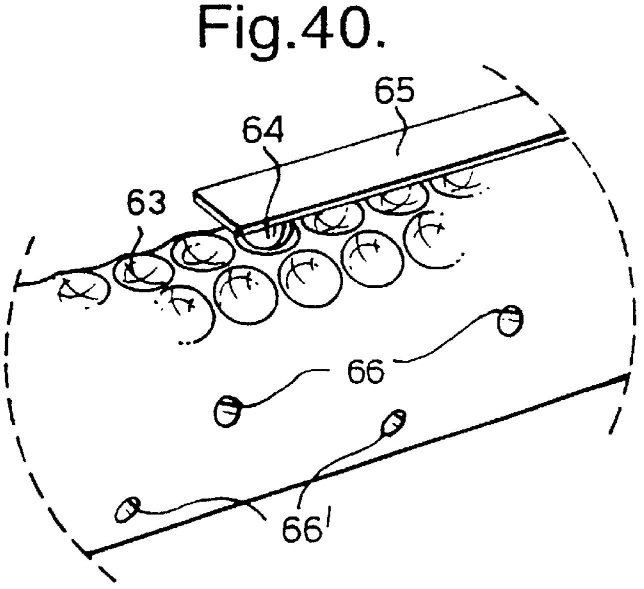

FIG. 40 is a fragmentary view of the code bar shown in FIG. 39.

Figure 41:
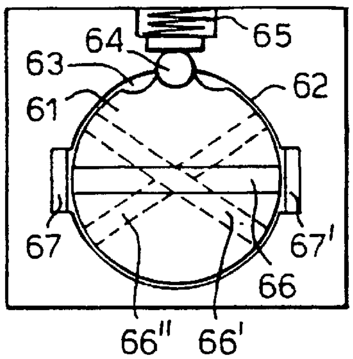

FIG. 41 shows the cross-section taken along the line XLI-XLI in FIG. 38.

Figure 42:
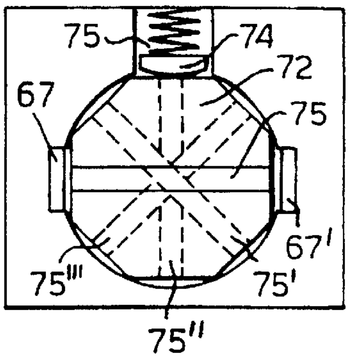

FIG. 42 shows a variant of that shown in FIG. 41.

Figure 43:
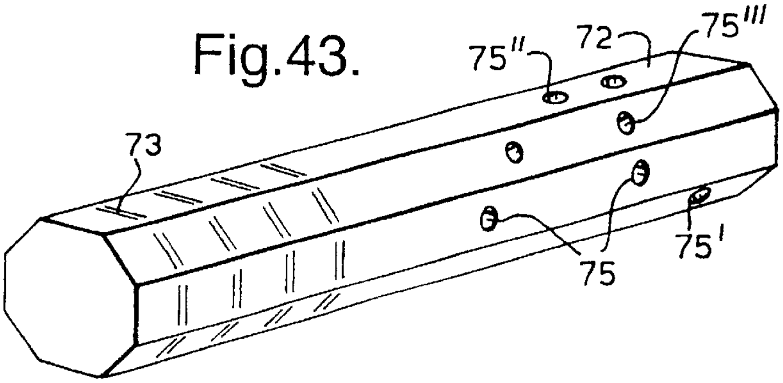

FIG. 43 shows a variant of the code bar as shown in FIG. 39, having a polygonal cross-section, and used, for example, as shown in FIG. 42.

Figure 44:
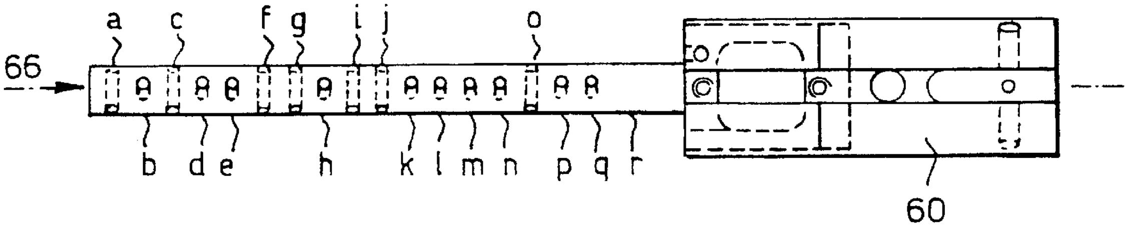

FIG. 44 shows an example of a typical code bar according to the invention.

FIG. 45 shows how the control button can be moved relative to a display.

FIG. 46 shows an arrangement of letters, characters and numbers which the device will be capable of providing on movement of the control button.

FIG. 47 is a typical, simplified circuit diagram for the device shown in, inter alia, FIG. 38.

Figure 48:
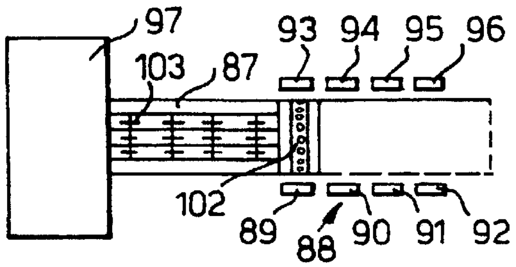
FIGS. 48–52 show a fourth embodiment of the device according to the invention, which is a modification of the third embodiment.

FIG. 48 shows a code bar with control means for introduction into a detector unit, seen from above.

Figure 49:
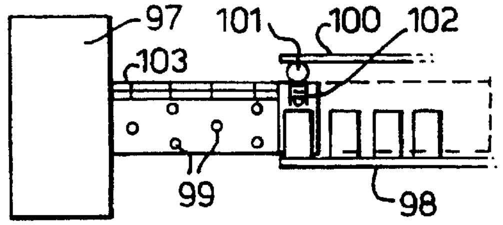

FIG. 49 is a side view of the device in FIG. 48.

Figure 50:
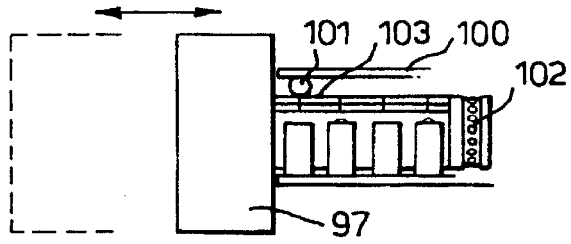

FIG. 50 shows the device in FIG. 49 with the code bar pushed all the way into the detector unit of the device.

Figure 51:
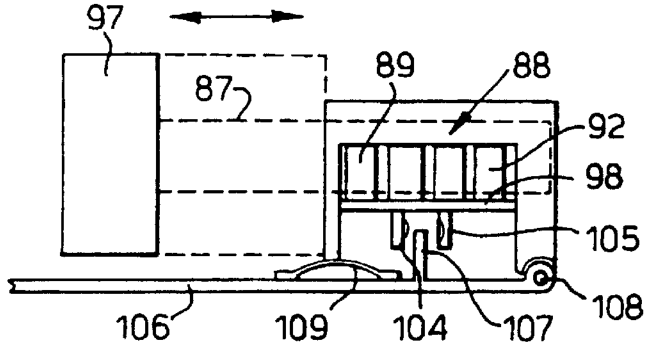
Figure 52:
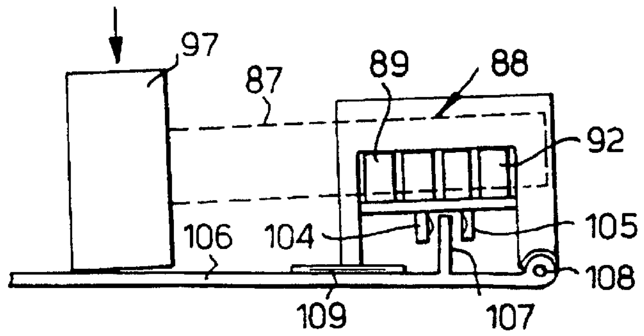

FIG. 51 shows the detector unit pivotally connected to a base member in a sprung manner, FIG. 52 showing how the detector unit together with the code bar can be tilted by depressing a control means.

Figure 53:
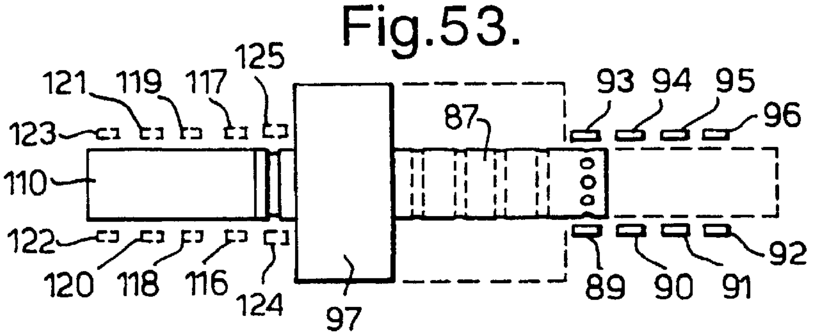
FIGS. 53 and 54 show a fifth embodiment of the device according to the invention, and represent a further modification of the third and fourth embodiments.
Figure 54:
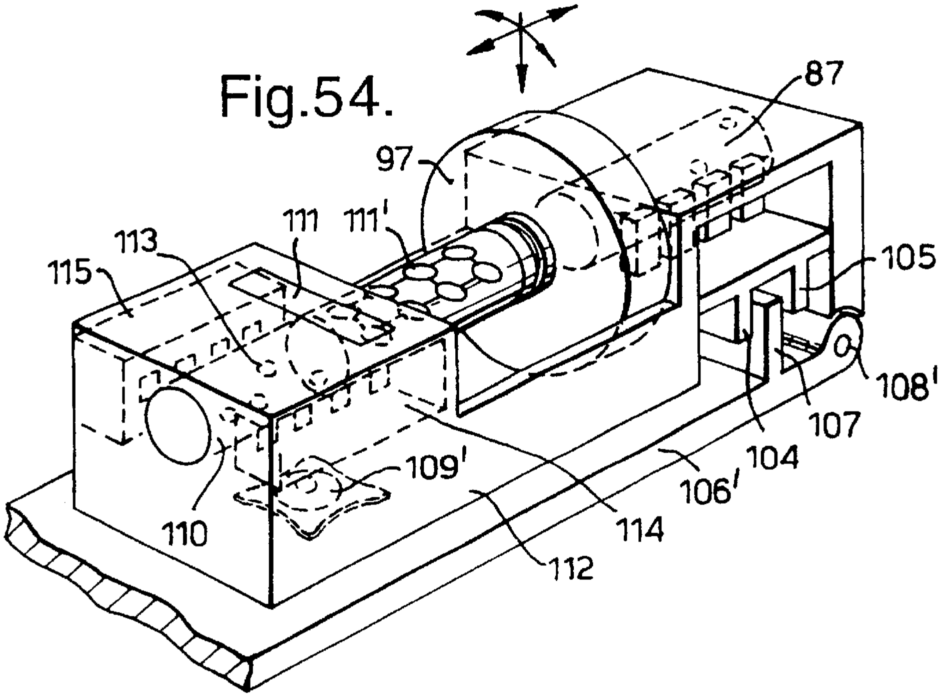

FIG. 53 and 54 show respectively from above and in perspective a modification of the device shown in FIGS. 48–50, 51 and 52, wherein the control means (e.g., a rotating wheel) on the side thereof that is opposite the code bar is equipped with a movement control or positioning bar. This may be advantageous in the event that positioning notches on the code bar would take an undue amount of space and thus have a unfavourable effect on the possible number of holes for detection through the code bar. The movement control bar may optionally also be designed as a supplementary code bar.

Figure 55:
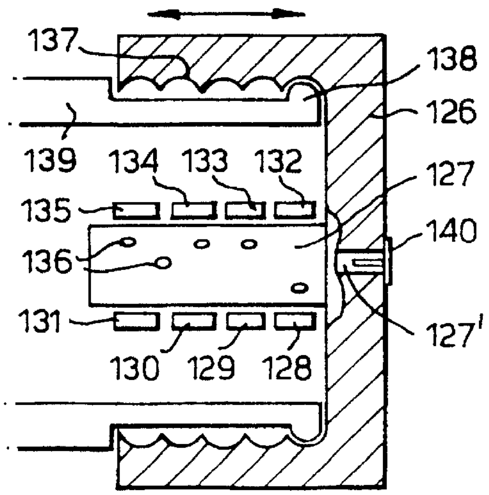
FIGS. 55 and 56 show a sixth embodiment of the device according to the invention, and represent a modification of the third and fourth embodiments.
Figure 56:
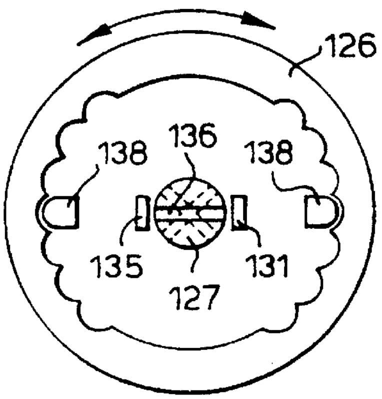

FIGS. 55 and 56 show in partial cross-section from above and in an end view, respectively, more active use of the control means for position control of the code bar.

Figure 57:
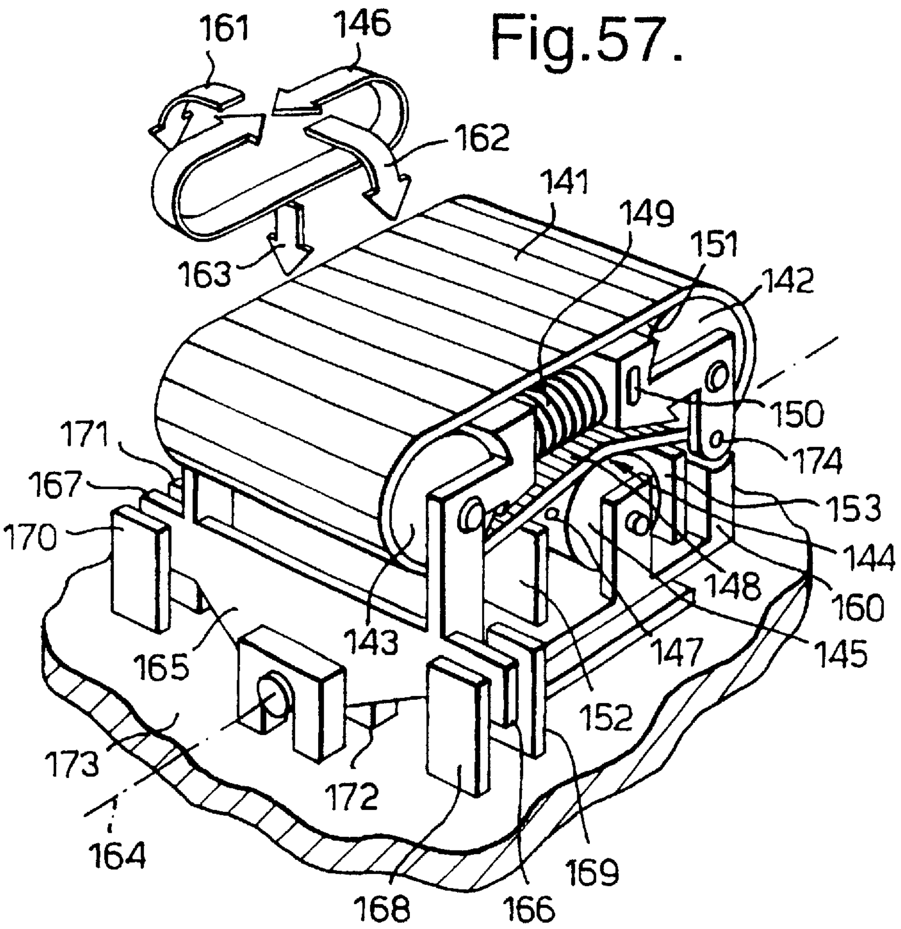
FIGS. 57 and 58 show a seventh embodiment of the device according to the invention, and represent a further development of said third, fourth and fifth embodiments and include the use of details from said first and second embodiments.

FIG. 57 shows modification of the device including the use of an endless belt passing over rollers, and wherein the belt forms rolling engagement with a pivotally supported code bar.

Figure 58A:
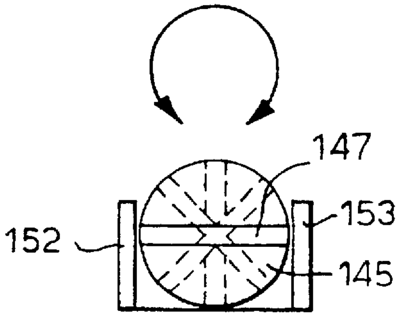
Figure 58B:
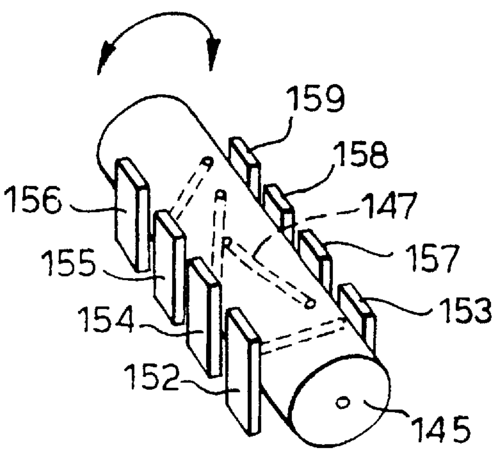

FIGS. 58*a* and 58*b* show further details in connection with the code bar in FIG. 57 and its associated light emitter/light receiver sets.

Figure 59:
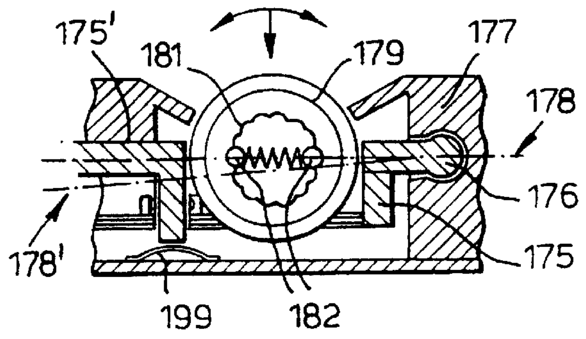
FIGS. 59–63 shows an eighth embodiment of the device according to the invention.
Figure 60:
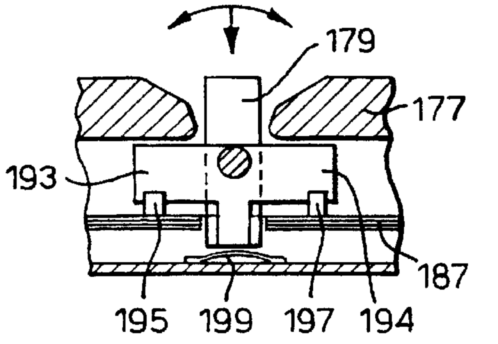
Figure 61:
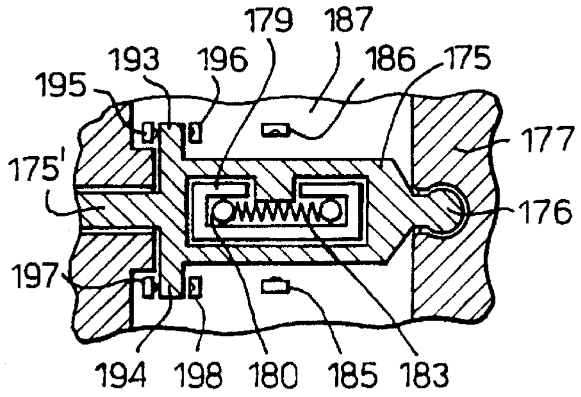
Figure 62:
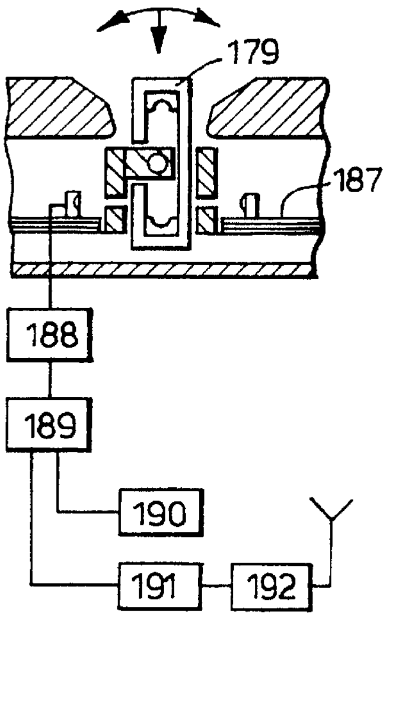
Figure 63:
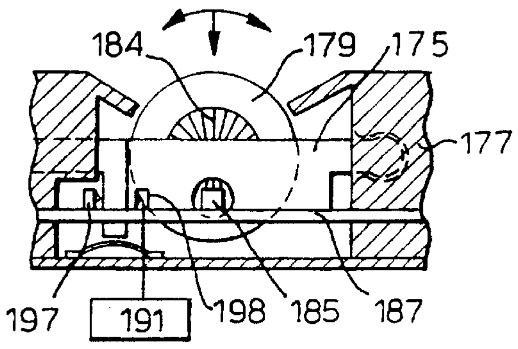

FIGS. 59–63 show a solution of the device wherein an optically readable code wheel is used which is supported in a cradle so as to be capable of stepwise rotation. FIG. 59 shows the device seen in section from the side; FIG. 60 is an end view of the device, seen in partial section; FIG. 61 shows, in partial section, the device seen from above; FIG. 62 shows a cross-section through the device taken transverse to the code wheel; and FIG. 63 shows the device, in partial section, seen from the side.

Figure 64:
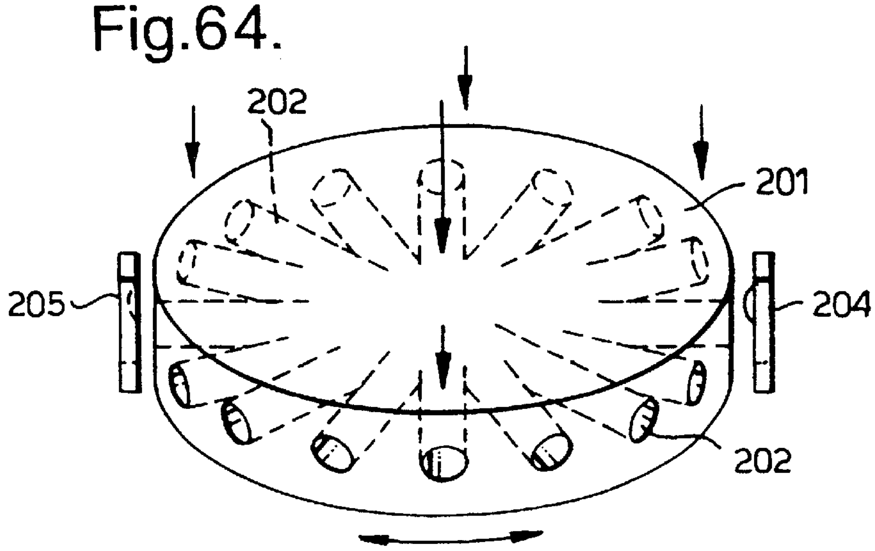
FIGS. 64–70 show a ninth embodiment of the device according to the invention.
Figure 65:
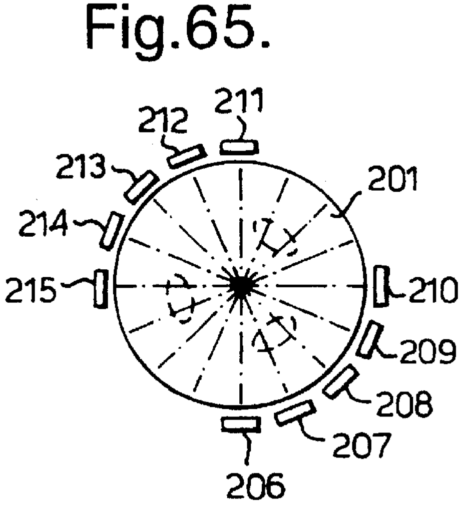
Figure 66:
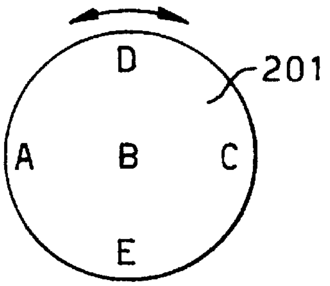
Figure 67:
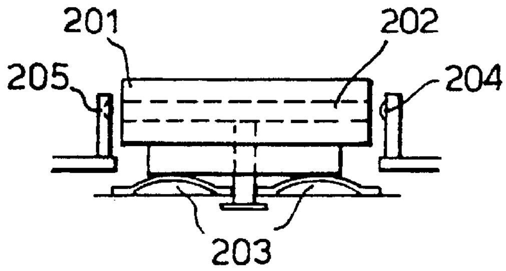
Figure 68:
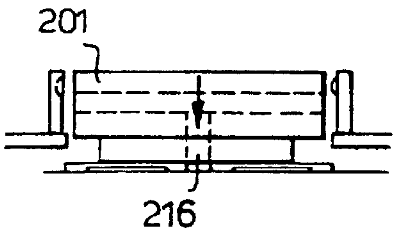
Figure 69:
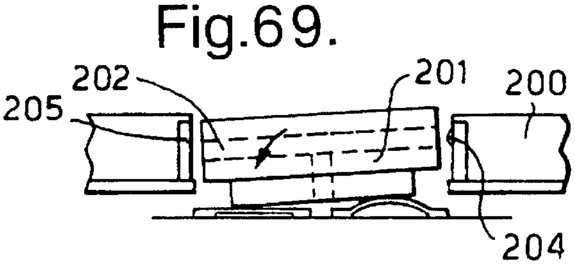
Figure 70:
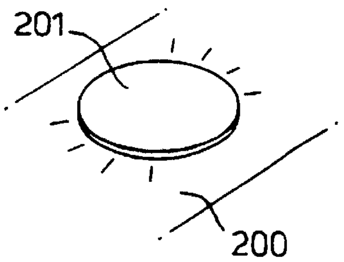

FIGS. 64–70 show an embodiment of the device, wherein a code wheel is used having diametrically disposed light-conveying channels and having one or more light emitter and light detector sets, wherein light emitters are disposed diametrically on the opposite side of the code wheel. FIG. 64 is a simplified perspective view of the device. FIG. 65 shows the device from above. FIG. 66 shows how the device can be depressed at different points. FIGS. 67, 68 and 69 show, from the side, how the device, against spring action, respectively can be held in a normal position, pushed straight downwards on central actuation of the code wheel or caused to tilt about the centre of the wheel by depressing the wheel at one of the indicated points on the periphery. FIG. 70 shows the wheel from above and in perspective mounted on an apparatus housing.

Figure 71:
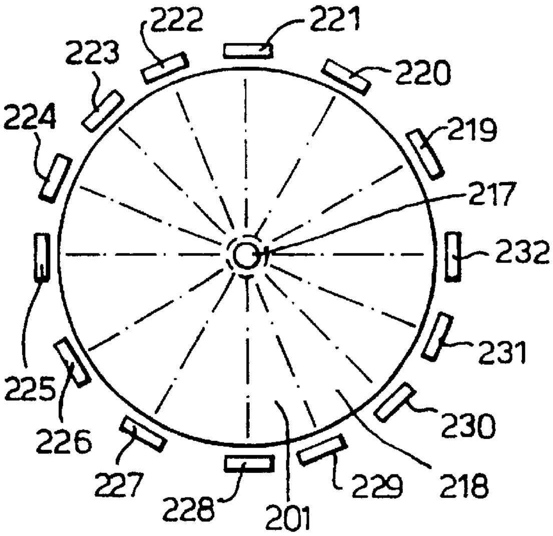
FIGS. 71 and 72 show a tenth embodiment of the device according to the invention, as a modified version of the ninth embodiment.
Figure 72:
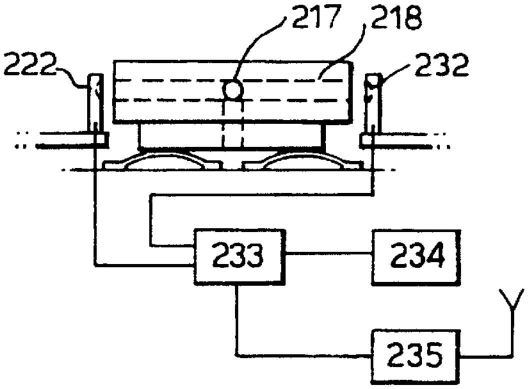
Figure 73A:
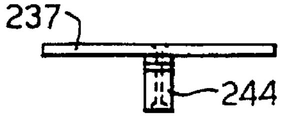
FIGS. 73–79 show an eleventh embodiment of the device according to the invention.
Figure 73B:
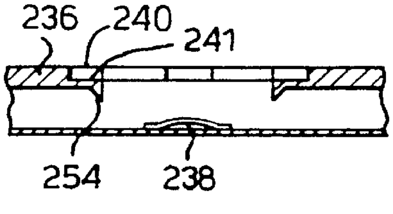
Figure 73C:
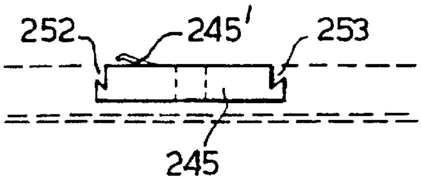

FIGS. 71 and 72 show a modification of the device shown in FIGS. 65 and 67, wherein there is a central, common light source and a plurality of light receivers. FIG. 71 shows the device seen from above and in partial section from the side.

Figure 74:
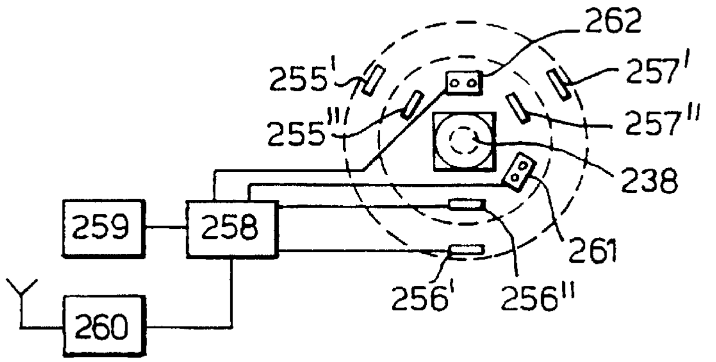
Figure 75:
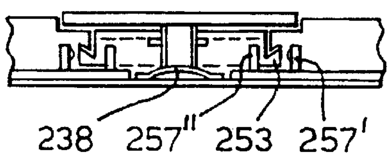
Figure 76:
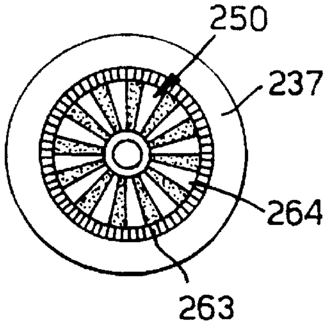
Figure 77:
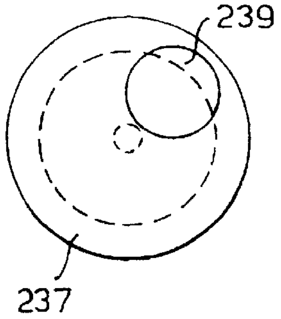
Figure 78:
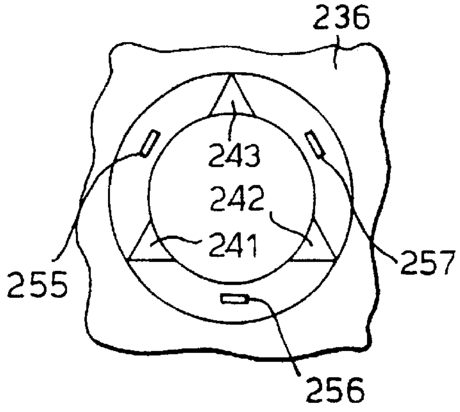
Figure 79:
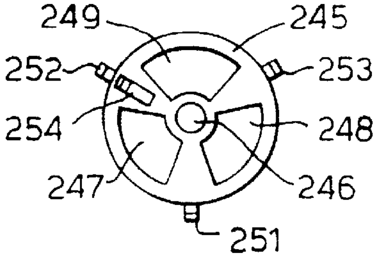

FIGS. 73–79 show another embodiment of the device wherein a code wheel is used with markings on the underside thereof instead of through light channels in the wheel. FIGS. 73*a, b* and *c* show three parts of which the device is composed, respectively a code wheel, a housing with a spring element and a mounting component for fixing the code wheel. FIGS. 74 and 75 show in addition a plurality of light emitters and light receivers for detecting the rotation of the wheel and the tilting of the wheel respectively. FIG. 76 shows the code wheel seen from the underside in a non-limiting embodiment. FIG. 77 shows the code wheel seen from above. FIG. 78 shows the housing component in FIG. 73*b* seen from above. FIG. 79 shows from above the component which is used for mounting the code wheel, as shown in section in FIG. 73.

Figure 80:
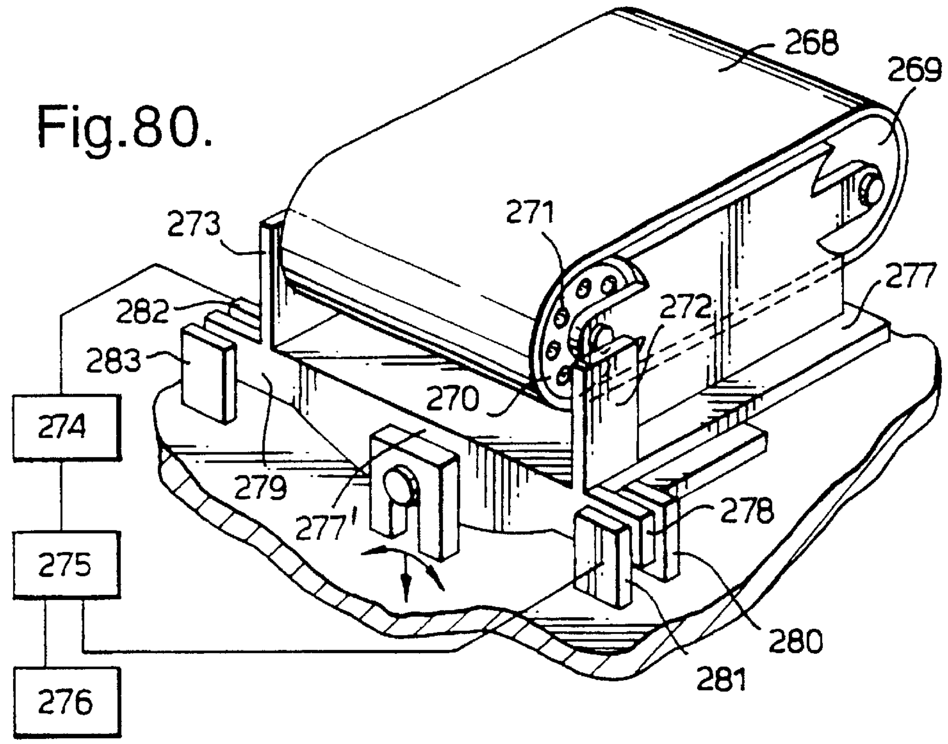
FIG. 80 shows a variant of the embodiment shown in FIG. 57.

FIG. 80 shows in perspective a variant of the embodiment shown in FIG. 57.

Figure 81:
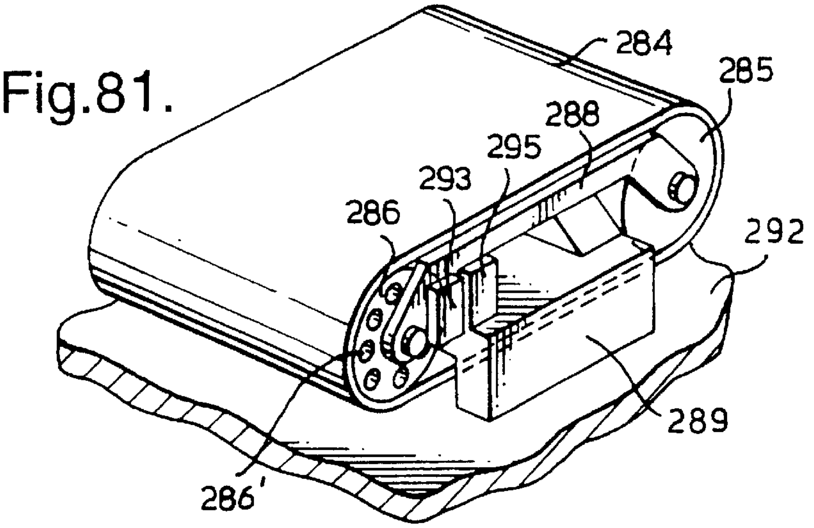
FIGS. 81–87 show another modification of the device shown in FIG. 80.
Figure 82:
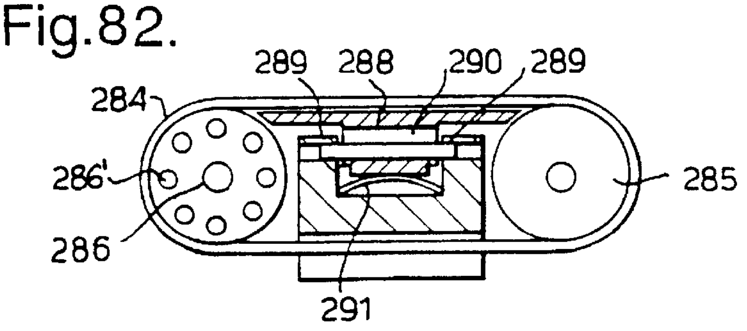
Figure 83:
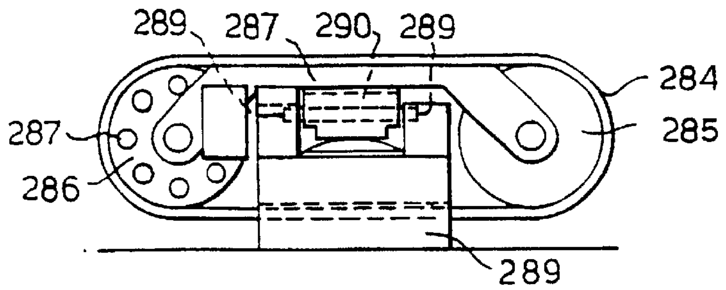
Figure 84:
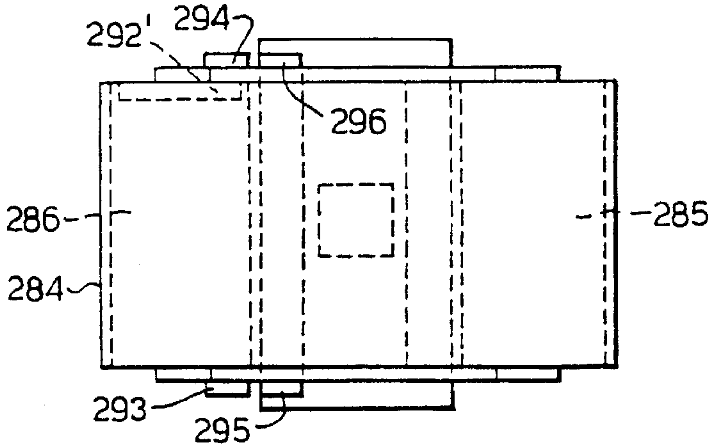
Figure 85:
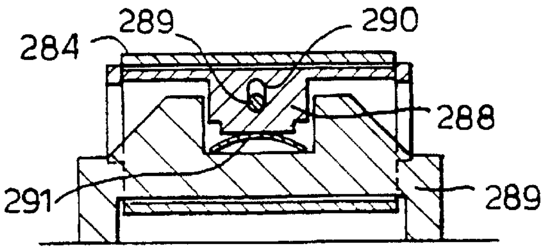
Figure 86:
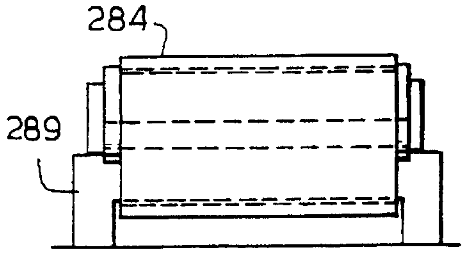
Figure 87:
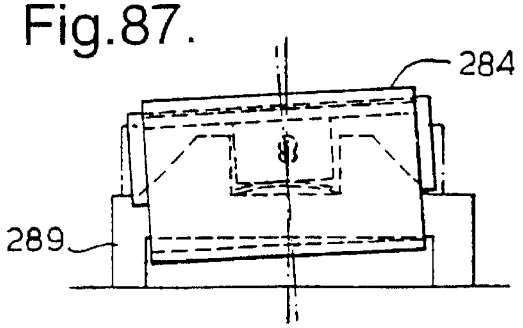

The solution shown in FIGS. 81–87 is a simplified version of the embodiment shown in FIG. 80, wherein FIG. 81 shows the device in perspective; FIG. 82 shows the device in longitudinal section seen in a first operational position; FIG. 83 shows the device seen from the side in a second operational position; FIG. 84 shows the device seen in a longitudinal, horizontal section; FIG. 85 shows a cross-section of the device; FIG. 86 is an end view of the device; and FIG. 87 is a end view of the device tilted to one side.

Figure 88:
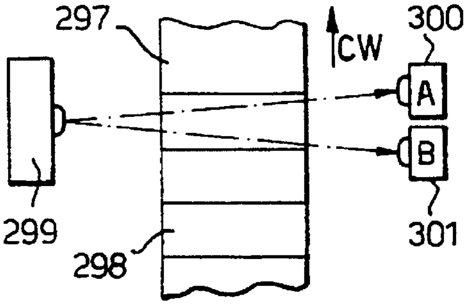
FIGS. 88–91 show in more detail the detection possibilities in connection with the embodiment of the invention shown in FIGS. 59–62.
Figure 89:
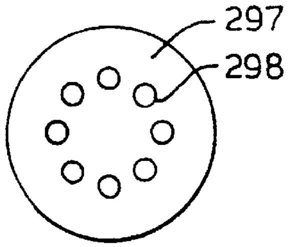
Figure 90:
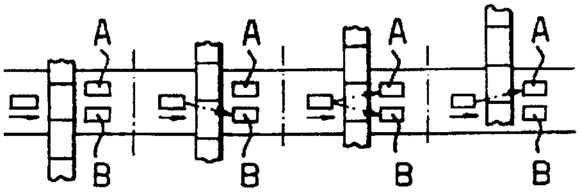
Figure 91:
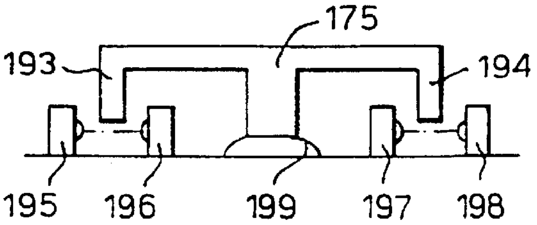

FIG. 88 shows the detection principle in connection with a code wheel as shown in FIGS. 59–62; FIGS. 89–90 illustrate the detection principle; and FIG. 91 shows what happens when the code wheel cradle is tilted to one side or the other or is pressed straight down.

Figure 92:
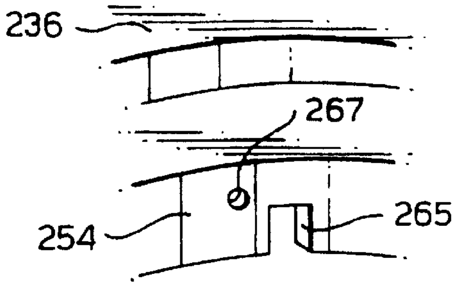
FIGS. 92–95 show further details of the embodiment shown in FIGS. 73–79.
Figure 93:
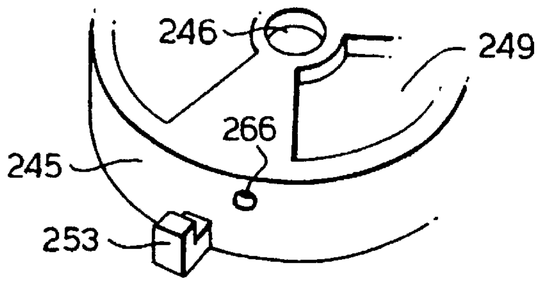
Figure 94:
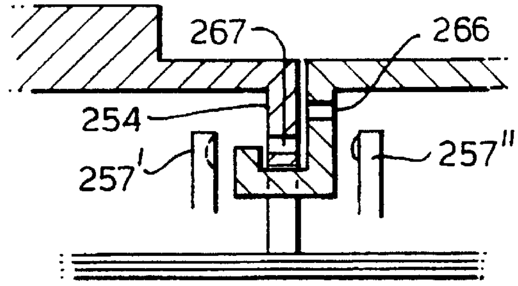
Figure 95:
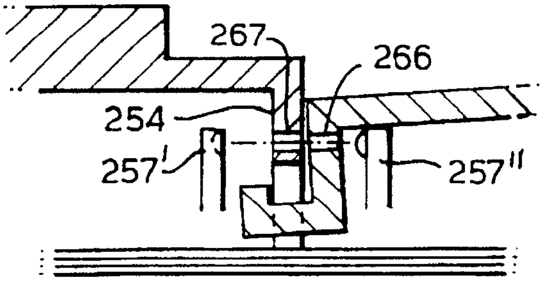

FIGS. 92–95 show further details of the embodiment shown in FIGS. 73–79, wherein FIG. 92 is a fragmentary view of the housing with bead, FIG. 93 shows details of the fixing bracket device, and FIGS. 94 and 95 show details of the interaction between the flange on the housing and the fixing bracket device.

Figure 96:
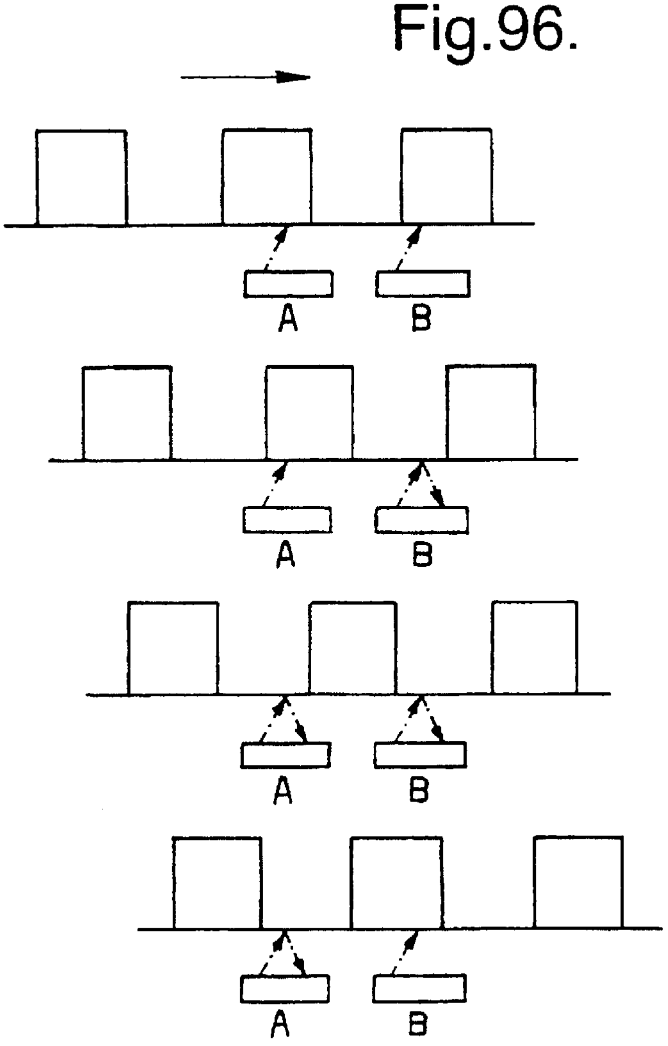
FIGS. 96 and 97 show in more detail typical detection possibilities associated with the subject matter shown and described in connection with FIGS. 73–79 and 92–95.
Figure 97:
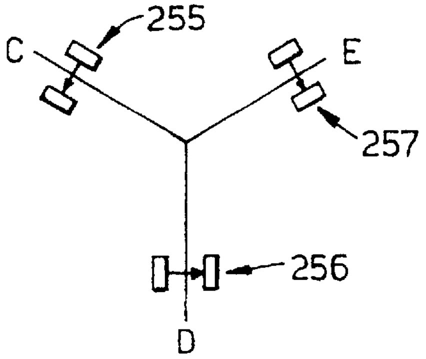

FIGS. 96 and 97 show in more detail typical detection possibilities associated with the subject matter shown and described in connection with FIGS. 73–79 and 92–95.

Figure 98:
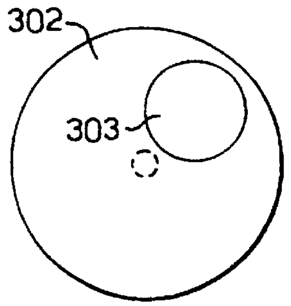
FIGS. 98–103 show the principle of a twelfth embodiment of the device according to the invention.
Figure 99:
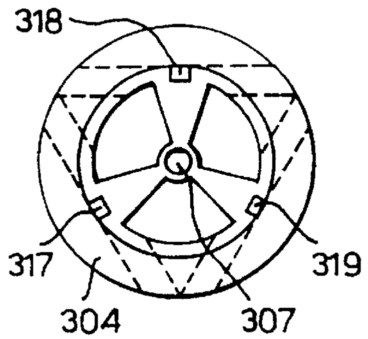
Figure 100:
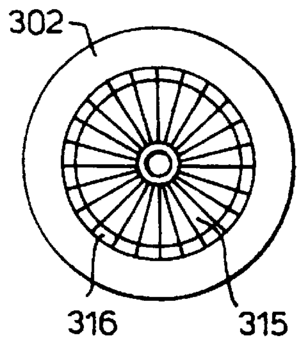
Figure 101:
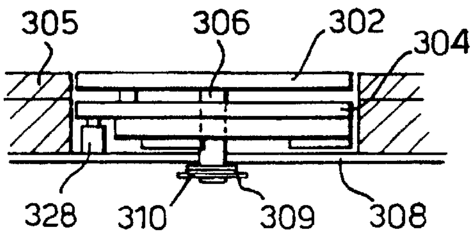
Figure 102:
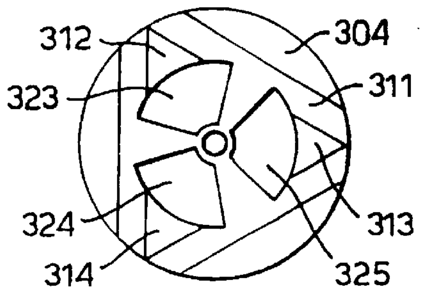
Figure 103:
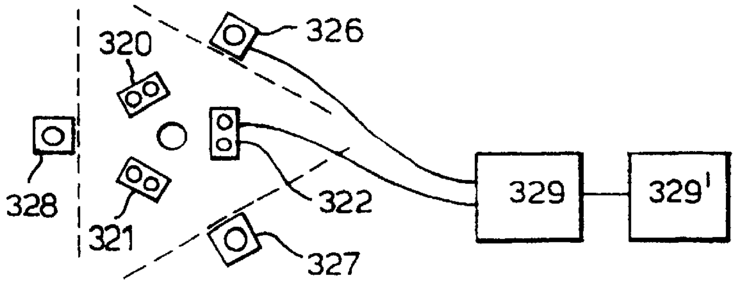

FIG. 98 shows the device seen from above, FIG. 99 shows a cradle which supports the control wheel of the device, FIG. 100 shows the control wheel seen from the underside, FIG. 101 shows the device seen from the side, FIG. 102 shows the cradle seen from below, and FIG. 103 shows the disposition of detectors on the base plate of the device.

Figure 112:
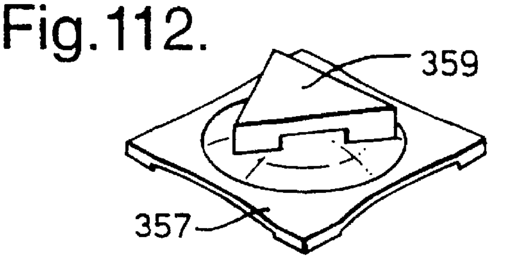
Figure 113:
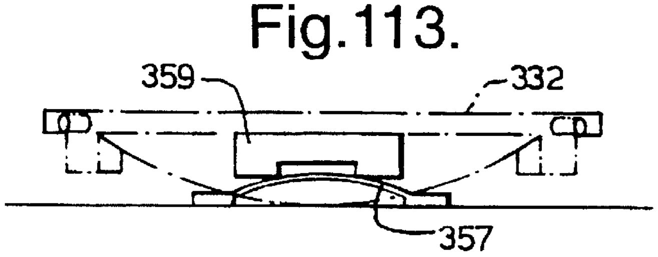
Figure 114:
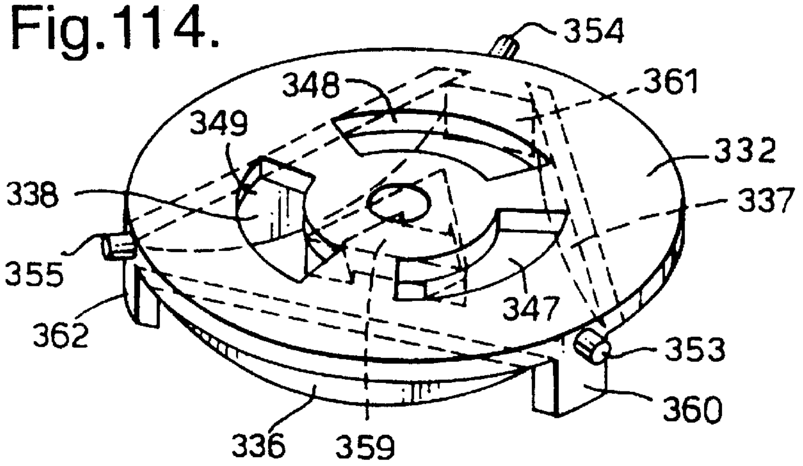
Figure 115:
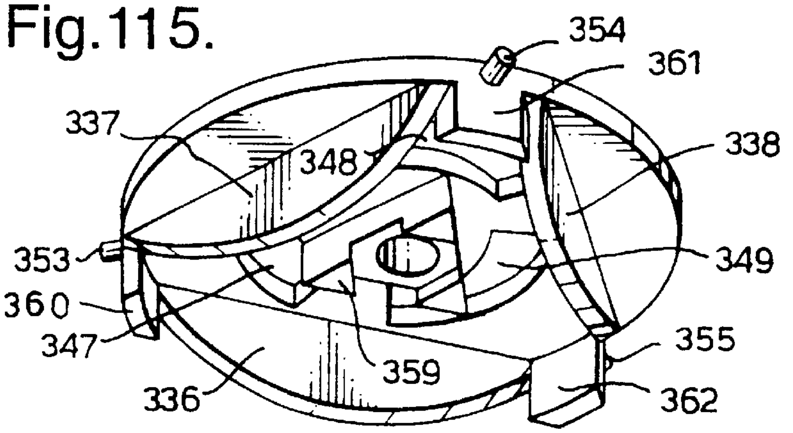

FIG. 104 shows the device seen from above; FIG. 105 shows a cradle seen from above; FIG. 106 shows the control wheel seen from below; FIG. 107 is a side view of the device; FIG. 108 shows the cradle from below; FIG. 109 shows the disposition of detectors on the device base plate; FIG. 110 shows a cross-section through the device; FIG. 111 shows the cradle seen from above; FIG. 112 and FIG. 113 are a perspective view and a side view, respectively, of details of the springing of the cradle; FIGS. 114 and 115 show respectively in perspective from above and from below the cradle as shown in FIG. 110 without the springing.

Figure 116:
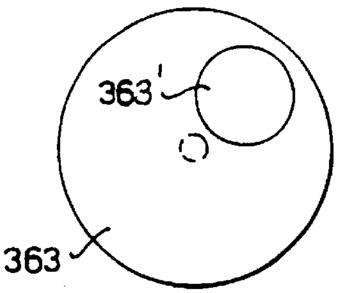
FIGS. 116–123 show a modification of the device shown in FIGS. 104–115.
Figure 117:
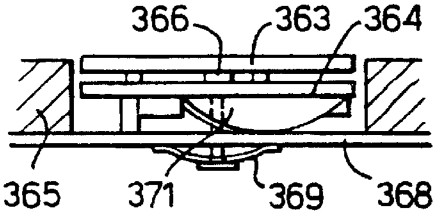
Figure 118:
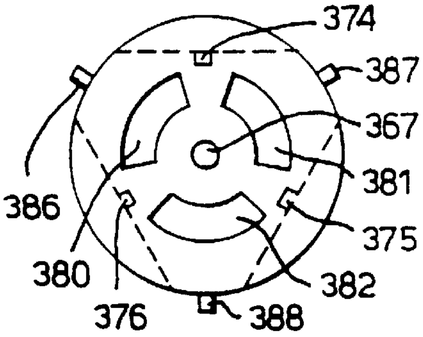
Figure 119:
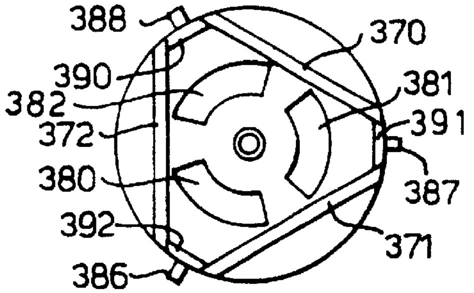
Figure 120:
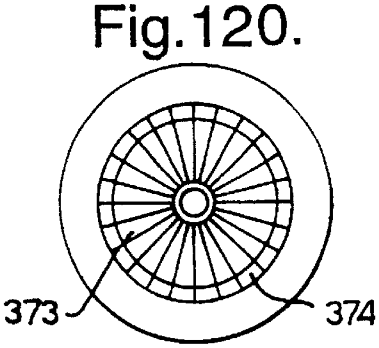
Figure 121:
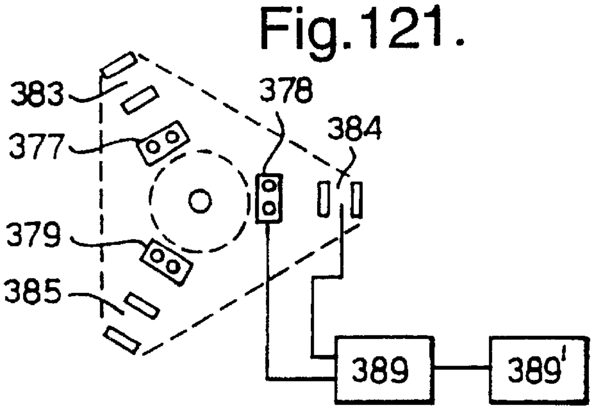
Figure 122:
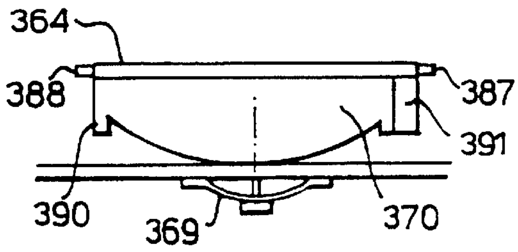
Figure 123:
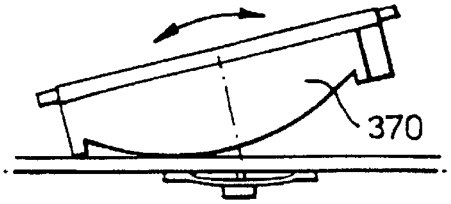

FIG. 116 shows a control wheel seen from above. FIG. 117 is a side view of the device. FIG. 118 is a cradle of the device seen from above. FIG. 119 is the cradle seen from below. FIG. 120 is the control wheel seen from below. FIG. 121 is the device base with detectors and processing equipment. FIGS. 122 and 123 show in side view the cradle in non-tilted and tilted state, respectively.

Figure 124:
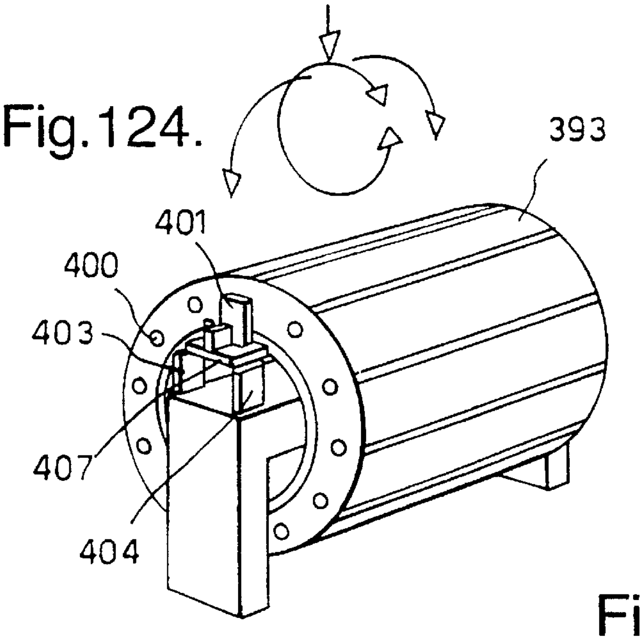
FIGS. 124–128 show a modification of the device shown in FIGS. 80–87.
Figure 125:
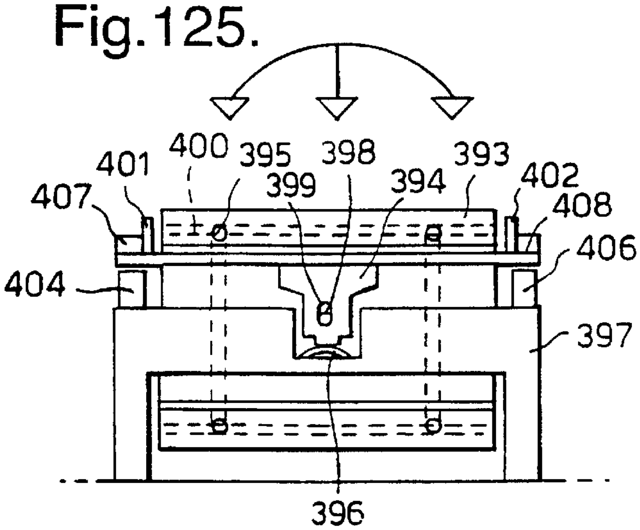
Figure 126:
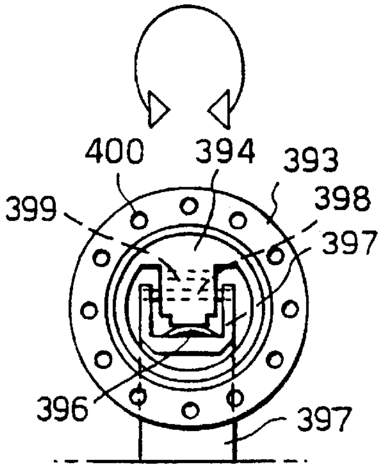
Figure 128:
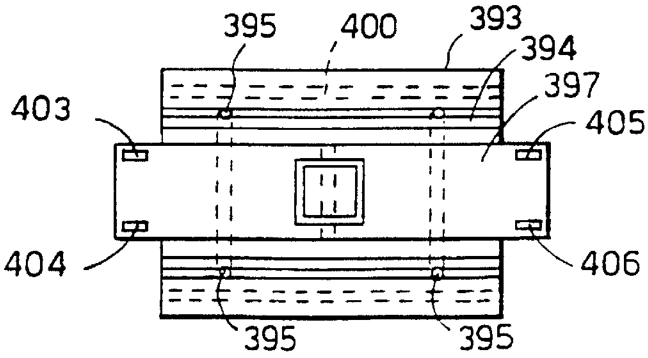
Figure 127:
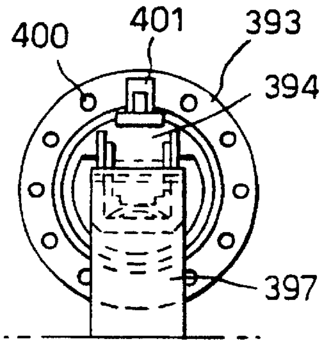

FIG. 124 shows the device in perspective view from one side and above. FIG. 125 is a vertical, longitudinal cross section of the device. FIG. 126 is a cross section through a mid portion of the device. FIG. 127 is an end view of the device. FIG. 128 is a longitudinal and horizontal mid cross section of the device.

Figure 129:
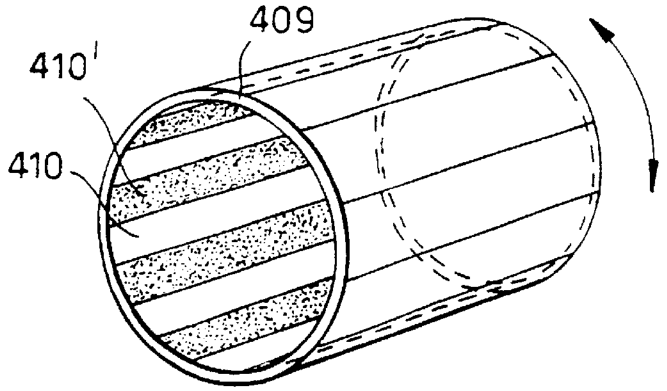
FIGS. 129–133 show a variant of the device shown in FIGS. 124–128.
Figure 130:
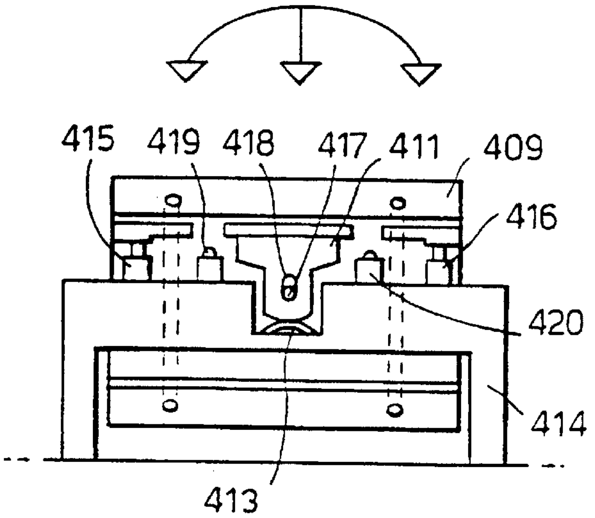
Figure 131:
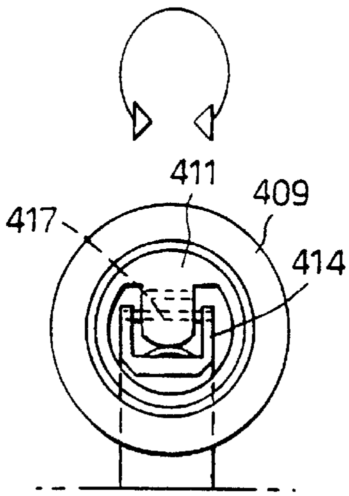
Figure 133:
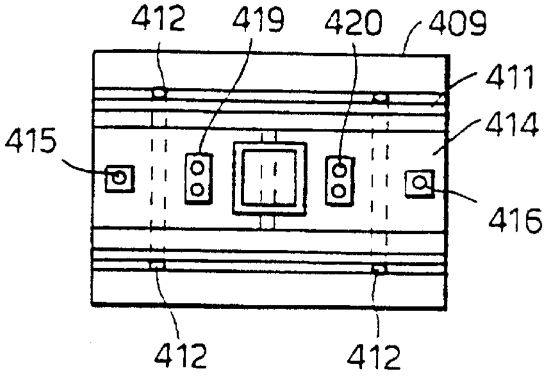
Figure 132:
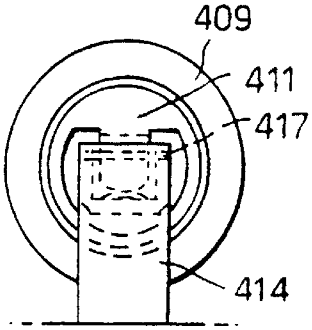

FIG. 129 shows a drum part of the device in perspective view from one side. FIG. 130 is a vertical and longitudinal cross section of the device. FIG. 131 is a cross section through a mid portion of the device. FIG. 132 is an end view of the device. FIG. 133 is a longitudinal and horizontal mid cross section of the device.

Figure 134:
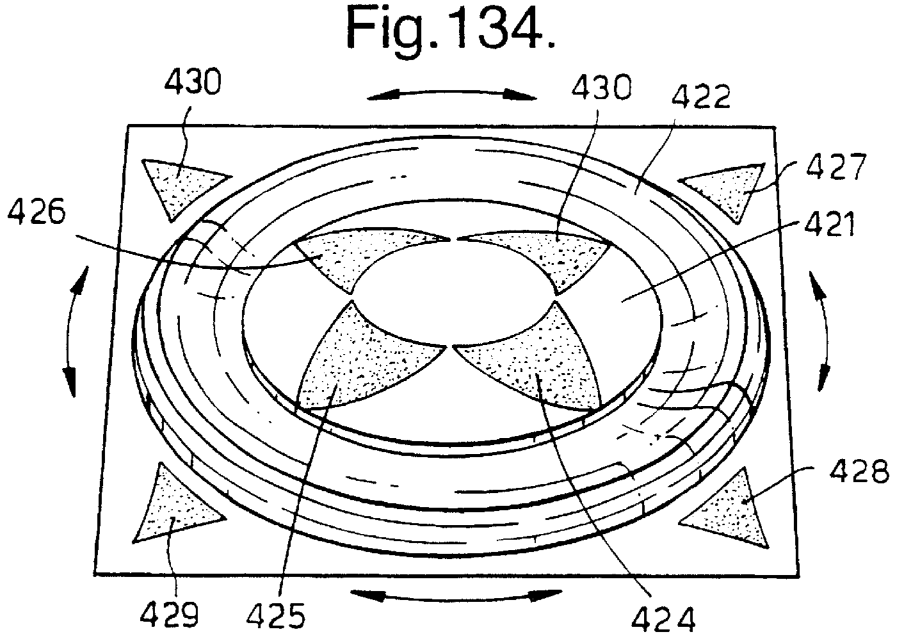
FIGS. 134–138 show a fourteenth embodiment of the device according to the invention.
Figure 135:
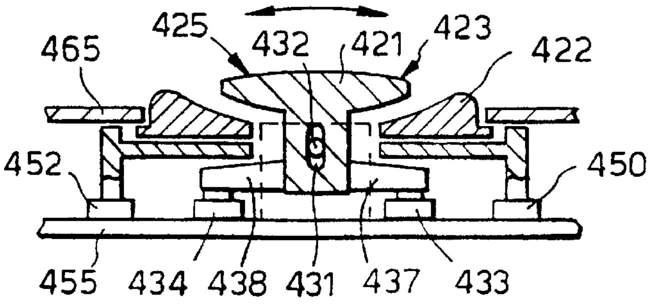
Figure 136:
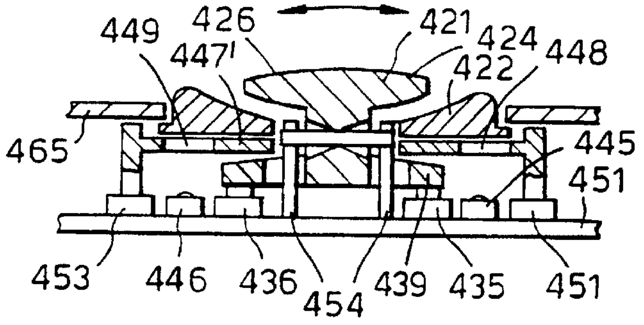
Figure 137:
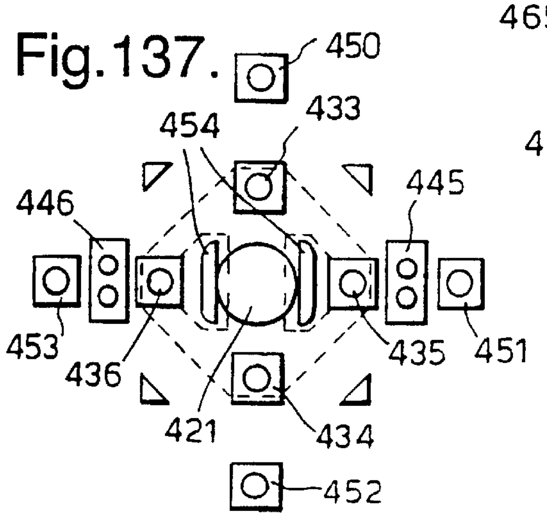
Figure 138:
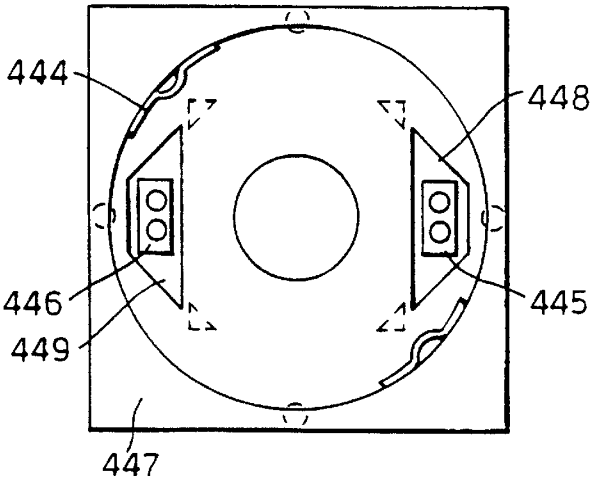

FIG. 134 is a top perspective view of the device. FIG. 135 is a cross sectional view, and FIG. 136 is a cross sectional view at 90° to the view of FIG. 135. FIG. 137 is a top view of a device base plate with detectors. FIG. 138 is a view from above of a frame part of the device, with two detectors on the base plate visible.

Figure 139:
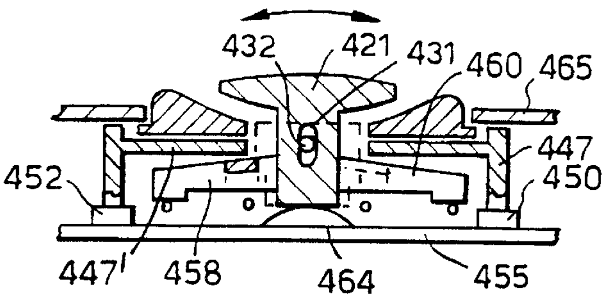
FIGS. 139–144 show a modification of the device shown in FIGS. 134–138.
Figure 140:
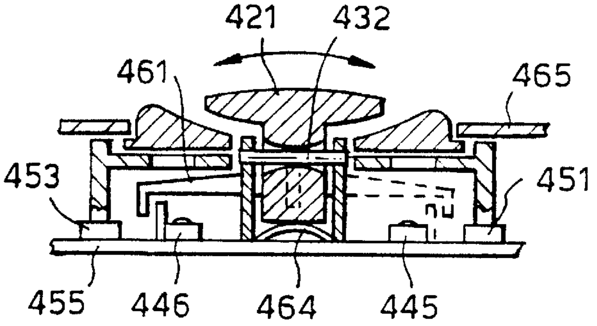
Figure 144:
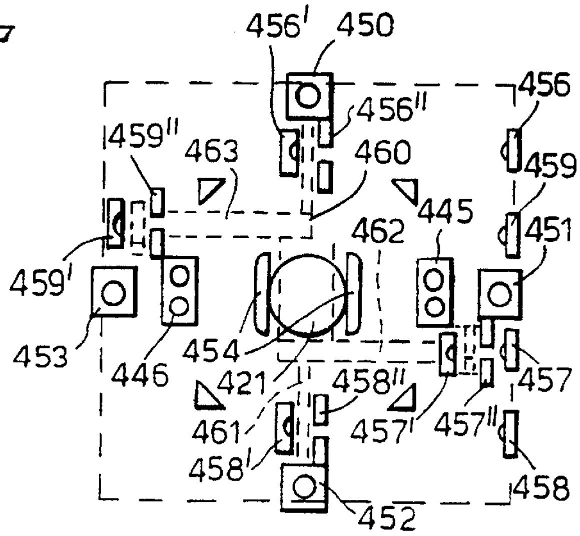
Figure 141:
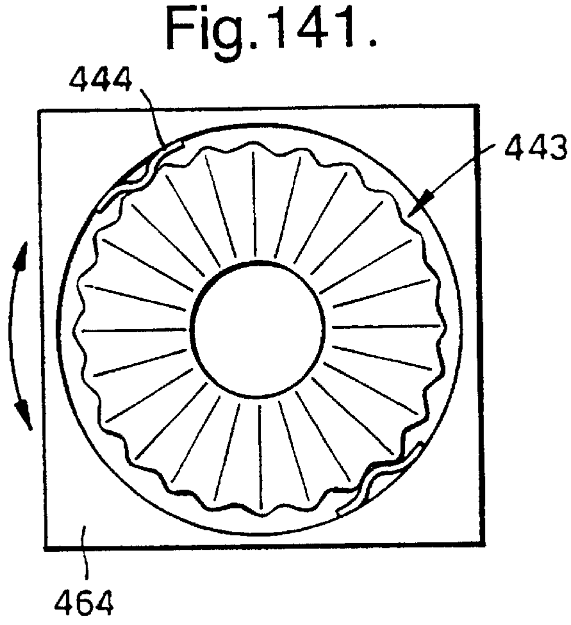
Figure 143:
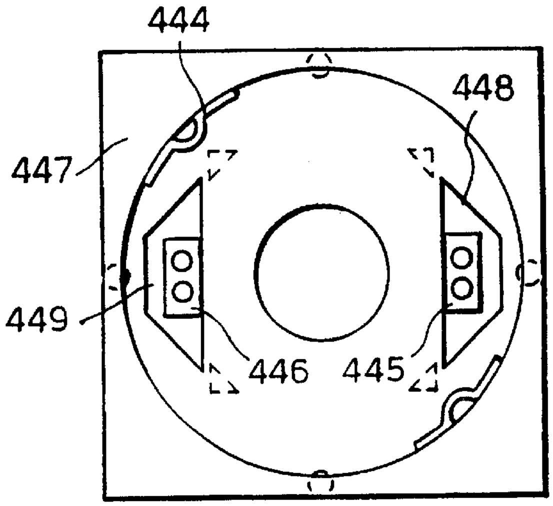
Figure 142:
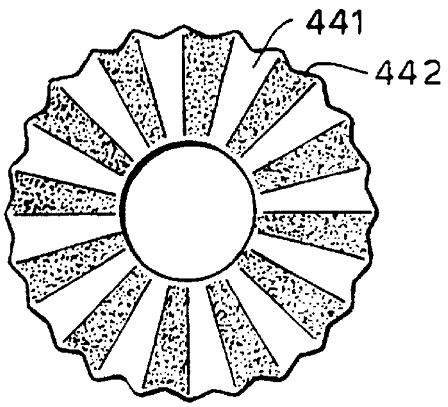

FIG. 139 is a cross sectional view, and FIG. 140 is a cross sectional view at 90° to the view of FIG. 139. A top view of the device will be similar to that of FIG. 134. FIG. 141 is a bottom view of a rotatable operating wheel. FIG. 142 illustrates an example of a light reflecting ring to be located on the bottom side of the operating wheel, the reflecting disc also having sectors of non-reflection. FIG. 143 is a view from above of a frame part of the device, with two detectors on the base plate visible. FIG. 144 is a top view of a base plate of the device with detectors installed.

The embodiments will now be described in more detail in the following description.

In FIG. 1 the reference numeral 1 indicates the key top member which has an elevation 2 for securing a suitable control button 3 (see FIGS. 6–10). The top member 1 has a downwardly directed portion 4 which is intended to block both or one of the light paths between the light emitters 5, 6 and their associated light receivers 5', 6'. The top member 1 also has another downward projecting portion 7 having recesses or holes 8', 8", 8'". Corresponding recesses will also be found on the side of the downward projecting portion 4 that is not visible in FIG. 1. The recesses 8', 8", 8'" are intended for interaction with holes or recesses 10', 10", 10" in a vertical portion 11 of the slide member 9. Small balls may be positioned between the respective recesses 8', 10'; 8", 10"; 8'", 10'" in a such a way that when the top member 1 is tilted to one side or the other about the ball between the recesses 8" and 10", the ball will disengage from either the recess 8' or 8'", depending upon the direction of tilt. Similarly, on the vertical portion 12 of the slide member 9 there may be provided corresponding recesses 13', 13", 13'" in corresponding interaction with recesses provided in the away-facing face of the downward projecting portion 4 of the top member 1. When, for instance, the top member 1 is tilted to one side or the other, recesses in the downward projecting portion 4 which correspond to recesses 13' or 13'" will disengage from the ball which is associated with the said recesses 13', 13'", whilst the turning or tilting takes place about a ball supported in the recess 13". When a tilting movement of this kind occurs, a typical indication of the tilting movement will be observed, since when the top member returns to its horizontal position wherein the recess pairs are parallel, all the balls will have snapped into place. For reasons of clarity, the balls are not shown in FIGS. 1 and 2.

To enable the downward projecting portions 4 and 7 of the tilting part to tilt relative to the slide member, respective openings 14, 15 are provided in the slide member. When, for instance, the top member is tilted to one side or the other, at least a part of the downward projecting portions 4 and 7 will move down into respective openings 14, 15. Instead of the recess or the hole 8" in interaction with a coupling ball and the recess or the hole 10", a pin 16 could have been used, e.g., fastened to the top member wherein the recess 8" is located, the top member 1 thus being equipped with a shaft, wherein the shaft 16 can be given support in the hole 10". In such a case, the recesses or the holes 8', 8'" and 10', 10'", for example, may be omitted, the snap retention of the tilting part in a neutral position being provided by the recesses located respectively in the vertical portion 12 and the downward projecting portion 4 and associated coupling balls.

In addition to the detector pairs 5, 5' and 6, 6', additional light emitters 17, 18 and light detectors 17', 18' may be provided, as indicated in FIG. 3. However, a more detailed explanation will be given later. In order to provide a stepwise displacement of the slide member 9 relative to the key base member 19, there may be provided an engaging spring 20 having a point 20' for successive interaction with a longitudinal row of recesses 21 on the underside of the slide member, as indicated in FIG. 9.

As can be seen from FIGS. 4 and 5 and also FIG. 9, the slide member 9, shown in a simplified form in FIGS. 4 and 5, has on its underside a T-shaped rib with an upright portion 22' and a beam portion 22". A plurality of transverse holes 23, 24, 25 and 26 may be provided in the T-rib 22 upright. There may of course be fewer or more holes, depending upon the technical requirements the device must meet. In addition, two through holes 27 and 28 are cut out in the T-rib beam 22" to provide light paths between the light emitter 5 and light detector 5' and the light emitter 6 and light detector 6", respectively.

As indicated below in connection with FIG. 21, the light emitters and light receivers may be connected to a control and detector circuit 29 which is only indicated symbolically in FIGS. 3, 4 and 5. However, it will be appreciated immediately that the location of such a circuit may of course be elsewhere in the device, optionally in connection with an extended portion of the base member 19.

FIG. 6 shows how the top member 1 can be mounted together with the slide member 9. In FIG. 6 the top member and the slide member are shown in a starting or neutral position. In FIG. 7 an end portion 1' of the top member 1 has been pushed downwards with the aid of the control button 3, so that all three of the recesses in the downward projecting portion 4 disengage with the balls associated with the recesses or the holes 13', 13", 13'" as indicated in FIG. 2.

In this position, the downward projecting portion 4 will block the light beams which would normally pass between the light emitter 5 and the light receiver 5', and the light emitter 6 and the light receiver 6' via respective holes 27, 28 in the T-piece 22 beam 22". An illustration of this is given in FIG. 9 on the right of the figure.

In FIG. 8 it is shown how the top part 1, which is in fact a tilting part, can be tilted to one side or the other, FIG. 8 showing only tilting to one side. However it will be understood that tilting can also take place to the opposite side. Tilting takes place as previously described about the effective tilt points formed, inter alia, by recesses 8", 10", here indicated by means of new reference numeral 30 for the sake of simplicity.

Advantageously, the previously mentioned (non-illustrated) balls may be spring-loaded or the vertical portions 11, 12 may be slightly elastically yielding.

Depending upon whether the top member 1 is tilted to one side or the other, or optionally pushed straight down with the downward projecting portion 4 through the opening or gap 15, different signals will be detected from the light receivers 5', 6'. If these signals are then collated with signals from the light receivers 17', 18', as the T-rib upright with its holes 23–26 moves past the light receivers 17', 18', binary codes will be capable of being formed for the different positions of the slide member 9 relative to the base member 19. As shown in the example and listed in Table II below, there are thus in actual fact three possible states of connection associated with the tilting/depression of the top member relative to the slide member through the opening 15, and wherein a single letter (A or B) indicates tilting and two letters indicate a depression to block both receivers 5' and 6' from receiving light. It should be observed that in the chosen example there are four possible position settings of the upright of the T-rib relative to the light receivers 17', 18'. However, the indicated number of positions are not to be understood as in any way defining the limits of the invention.

The light emitters and the light receivers and the circuit 29 with appurtenant components may be placed in the bottom of the base member 19, or the base member may be composed of a circuit board. The light emitters 5, 6 and 17, 18 may, for example, consist of light diodes.

When both light paths between the light emitters 5, 6 and respective light receivers 5', 6' are blocked by the downward projecting portion 4, the binary code 00 will in fact be detected. When only one of these light paths is blocked by the downward projecting portion 4, a binary code 01 or 10 is detectable.

If the beam 22" represents status changes in the x direction and movement of the upright 22' will result in changes in the y direction, and also if tilting one way or the other or depression of the downward projecting portion 4 of the top member 1 represents movement in the z direction, the table below can be drawn up. Binary codes will thus be generated for the respective tilting and depression positions and the displacement which takes place in the longitudinal direction of the slide member relative to the base member. Table I below shows as an example desired commands when using the invention as, for example, a keypad for a telephone, and the table below shows the digits and characters which have respective binary codes. The number of desired commands as indicated in Table I may of course be increased by increasing the number of light emitters and light detectors which are to interact with the post 22' of the T-rib.

TABLE I

| | | |
|---|---|---|
| 1 | 2 | 3 |
| 4 | 5 | 6 |
| 7 | 8 | 9 |
| * | 0 | # |

TABLE II

| | Code | | Position in | Press in the |
|---|---|---|---|---|
| Digit | X | Y | Y direction | Z direction |
| 1 | 01 | 00 | 1 | A |
| 2 | 00 | 00 | 1 | A and B |
| 3 | 10 | 00 | 1 | B |
| 4 | 01 | 10 | 2 | A |
| 5 | 00 | 10 | 2 | A and B |
| 6 | 10 | 10 | 2 | B |
| 7 | 00 | 11 | 3 | A |
| 8 | 01 | 11 | 3 | A and B |
| 9 | 10 | 11 | 3 | B |
| 0 | 00 | 01 | 4 | A |
| * | 01 | 01 | 4 | A and B |
| # | 10 | 01 | 4 | B |

The top member 1, the slide member 9 and the base member 19 may advantageously be built into a housing consisting of a top 31 and a bottom 32. Both the top 31 and the bottom 32 may have space for electronic equipment or power supply as indicated by the recesses 31' and 32'.

Another embodiment of the device according to the invention will now be described with reference to FIGS. 11–37.

FIG. 11 shows a top 33 and a bottom 34 of a housing which is to hold the device according to the invention. There are cut-outs 33' and 33" and similarly 34', 34", 34" intended to contain both moveable and stationary elements which are constituent parts of the device. In FIG. 16 the slide member is indicated by means of the reference numeral 35, and it will be seen that on the side of the slide member 35 there is a plurality of recesses 36 which are intended for interaction with a positioning spring 37. The cut-outs 33" are intended for display or indicator elements, e.g., in the form of light diodes 38, 39, 40 and 41, to indicate more precisely the position of the control key 42 relative to the base member of the device, as will be explained below. Holes 38', 39', 40', 41' are thus provided in connection with the cut-outs 33" to allow the passage of light from the light diodes 38–41. It will be appreciated that the light diodes may possibly be replaced by a display, e.g., an LCD panel.

The housing top 33 is equipped with guides 43 for the device control key and the slide member included in the device.

A cover plate 44 may be provided in connection with the control key 42 to protect the opening 45 from dust, foreign bodies or the like, when the control key is moved back and forth in the guide 43.

The array of light emitters and light receivers and the unit 29 are as shown and described in connection with FIGS. 1–10. In FIG. 21 the reference numeral 46 designates external equipment in the form of, e.g., communications equipment, additional computing equipment, display panels etc.

The slide member 35 is shown in more detail in FIGS. 22–24. The slide member has an attachment piece 42' for the control key 42. The attachment piece 42' is pivotally supported about a shaft 47 which constitutes a fixed part of the slide member 35. Relative to the shaft 47, the attachment piece 42' has minimum lateral clearance, but a certain vertical clearance, thereby allowing the control key to be moved some way downwards.

The control key 42 will thus be capable of being moved straight downwards (the Z direction) and also of being tilted to one side or the other about the axis 47. In order to effect stabilisation of the control key 42 when it is not in use or is in a neutral position, as shown in FIG. 25, a spring 48, e.g., a spring of the disc type or a curved leaf spring, may be disposed between the control key attachment piece 42' and the slide member 35. The slide member has two downward sloping portions, of which one is shown in FIG. 22 and indicated by means of the reference numeral 49. At the bottom, this portion 49 has a downward projecting piece 50 having a hole 51 for the passage of light, e.g., between the light emitter 5 and the light receiver 5' or the light emitter 6 and light receiver 6', as the case may be. Spring tongues 52, 53 are provided in connection with the downward projecting portions 49, but of these only spring tongue 52 is shown in FIG. 22. At one end of the slide member 35, the spring tongues are fixedly attached thereto, e.g., by means of a screw connection 54. As closer scrutiny of FIG. 22 will reveal, the control key attachment piece 42' has at the bottom a bevel which is approximately parallel to the bevelled or sloping portion 49 of the slide member. Depression of the control key 42 will thus cause this key to press on the leaf spring 52 and/or 53, thereby causing the leaf spring to lie down against the sloping or bevelled portion 49 of the slide member 35. It will be seen that the leaf spring at the end opposite the attachment end thereof has a downward projecting portion or cross piece 52', 53' which, when the leaf spring is depressed, will lie in front of the hole 51 in the downward projecting portion 50 of the slide member. Thus, said piece 52'; 53' will prevent passage of light between, e.g., the light emitter 5 and the light receiver 5' or the light emitter 6 and the light receiver 6'.

In FIG. 25 it will be seen that the slide member may have an approximately T-shaped rib on its underside as explained in connection with FIGS. 1–10. However, it is fully conceivable that at least the upright of the rib may be divided into separate pieces, such as, e.g., 50' and 50", shown in FIG. 22 and FIG. 29. In the downward projecting piece 50 of the slide member 35, which will in fact form the beam of the T-rib, there are two holes indicated here by means of the reference numerals 51' and 51", respectively. When the control key 42 is tilted to one side or the other, e.g., in the direction indicated by the arrow 56, the key 42 against the action of the spring 48 will cause the spring tongue 52 to move downwards into abutment against the sloping portion 49, thereby blocking the aperture 51". The control key 42 has thus been depressed on the "b" side. If the control key 42 is pushed axially downwards in the direction of the arrow 57 as indicated in FIG. 27, both apertures 51' and 51" will be blocked.

Figure 30:
Figure 31:
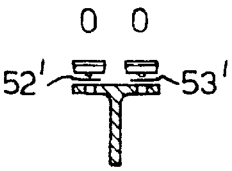
Figure 32:
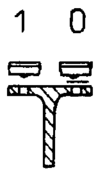
Figure 33:
Figure 34:
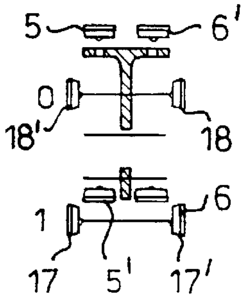
Figure 35:
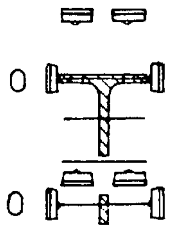
Figure 36:
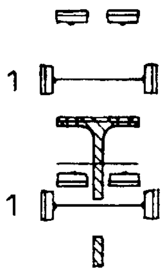
Figure 37:
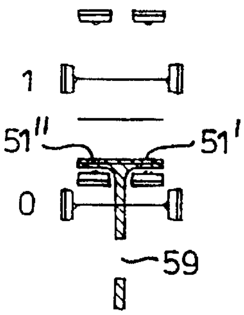

The situation in FIG. 25 recurs in FIG. 30, whilst the situation in FIGS. 26 and 27 recurs in FIGS. 32 and 31 respectively. By moving the slide member 35 relative to the base member 58 of the keypad device, in the present case made in the form of a circuit board, it will be possible to establish a binary coding for the different positions of the slide member relative to the base member, the "upright" of said T-rib having a hole or cut-out 59 through which light can pass between a light emitter and a light detector.

Thus, during the movement of the slide member 35 relative to the base member 58 a coding pattern is formed that corresponds to that shown in Table II and which is given below in Table III.

TABLE III

| Character | X | Y | Press in the Z direction |
|---|---|---|---|
| 1 | 01 | 01 | B |
| 2 | 00 | 01 | A and B |
| 3 | 10 | 01 | A |
| 4 | 01 | 00 | B |
| 5 | 00 | 00 | A and B |
| 6 | 10 | 00 | A |
| 7 | 01 | 11 | B |
| 8 | 00 | 11 | A and B |
| 9 | 10 | 11 | A |
| 0 | 01 | 10 | B |
| * | 00 | 10 | A and B |
| # | 10 | 10 | A |

From that shown in FIGS. 28 and 29 (see also FIGS. 34–37), compared to that which is evident from, for example, FIG. 3, it will be seen that the light emitter 6 and the light receiver 6' have exchanged places, and similarly the light emitter 18 and the light receiver 18' have exchanged places. The purpose of such switching is to avoid "light crosstalk", i.e., that light from two light emitters can strike respective non-associated light receivers. The embodiment shown in FIGS. 28 and 29 is therefore considered to be the embodiment preferred at present as regards the positioning of light emitters and light receivers.

In connection with FIG. 26 it should be noted that if the edge 42" of the control key attachment piece 42' comes to rest against the underside of an underside portion of the housing top 33, a larger torque towards the spring tongues 52 or 53 will be provided.

Yet another embodiment of the device will now be described with reference to attached FIGS. 38–47.

FIG. 38 shows a stationary detector unit 60 and a slide member 61 which is made in the form of a code bar. The stationary part 60 has a through, longitudinal channel 62 as shown on FIG. 41. To guide the code bar stepwise relative to the stationary part 60, the code bar may be made with markings or recesses which interact with an engaging means 64, e.g., a ball, rib or the like, which is spring-mounted with the aid of a spring 65 which is secured to the stationary part 60 at one end thereof, indicated by means of the reference numeral 65'. In the longitudinal direction of the code bar 61 and spaced apart at regular intervals, are provided transverse holes 66. On each side of the code bar or slide member 61 at least a first and a second light emitter 67/light receiver 67'; 68, 68' sets are provided for light emission and detection of received light transverse to the channel 62 through the code bar holes 66. It will also be possible to provide several parallel holes such as the holes 66' and 66", wherein these sets of holes can form an angle to one another in the range of 0°–360°. In an embodiment that should not be seen as defining the limits of the invention the angle range is, e.g., 5°–90°. It would, of course, be possible to have, e.g., two or three set of holes, although even more sets are conceivable.

Although there may be at least a first and a second set of light emitter/light receiver pairs 67, 67'; 68, 68', it would be preferable to use several such light emitter/light receiver pairs in the form of, e.g., third, fourth and fifth sets as indicated in FIGS. 38 and 47 and indicated by means of the respective reference numerals 69, 69'; 70, 70'; 71, 71'. The sets of light emitters/light receivers may be placed on a common circuit board, as explained, for example, in connection with FIG. 29. The stepwise mechanical movement of the slide member 61 relative to the stationary part 60 will cause passage of light through holes 66, 66' or 66" in the code bar, or non-passage of light through the code bar to the respective light receivers 67', 68', 69', 70' and 71', which will result in the output from the light receivers being converted to respective sets of binary "1" and "0" characters.

Although a code bar having an essentially circular cross-section, as shown in FIGS. 38, 39 and 41, would be preferred, it is nevertheless possible within the scope of the invention to choose a code bar design which has essentially a polygonal cross-section, e.g., hexagonal. This is shown in more detail in FIGS. 42 and 43, wherein the code bar is designated by the reference numeral 72. In these figures markings or recesses 73 have been placed around the periphery of the code bar, and these interact with a spring-tensioned engaging part 74 tensioned by a spring 75. In this case it may be advantageous to allow the holes, here indicated by the reference numerals 75, 75', 75" and 75'", to extend from one side face of the polygonal code bar to the opposite side face, as is shown clearly in FIG. 42. As is evident from FIGS. 41 and 42, it would be expedient if the said sets of holes were to pass through and transverse to the longitudinal central axis of the code bar. As indicated in FIGS. 39 and 43, the holes in one set, e.g., the set 66; 75, may lie in respective transverse planes on the code bar, which are different for holes in other hole sets, such as, e.g., the sets 66', 66". However, it is conceivable that at least one of the holes in a first set, e.g., the set 75, could lie on the same plane as one of the holes in a second set, e.g., the set. 75'", as can be seen in FIG. 43. The same also applies in connection with FIG. 39 and holes 66' and 66".

The embodiment will now be described in more detail with reference to FIG. 44 wherein the point of departure is a row of holes which by means of the arrow is indicated by reference numeral 66. This row of holes consists of the holes indicated by the letters b, d, e, h, k, l, m, n, p and q. It will be seen that the angularly offset row consisting of the holes a, c, f, g, i, j, and o will not permit passage of light when the code bar is adjusted so that the light detectors in the stationary part are adapted to intercept light through only the row of holes 66.

When a code bar of this type is moved past the detector array 67, 67', 68, 68', 69, 69', 70, 70' and 71, 71', due to the stepwise movement of the code bar a binary code pattern as can be seen from Table IV below will be produced successively, wherein at the points a–r it is indicated whether there is any passage of light LP or not through the row of holes 66.

TABLE IV

| LP<br>Ch. | 0<br>a | 1<br>b | 0<br>c | 1<br>d | 1<br>e | 0<br>f | 0<br>g | 1<br>h | 0<br>i | 0<br>f | 1<br>k | 1<br>l | 1<br>m | 1<br>n | 0<br>o | 1<br>p | 1<br>q | 1<br>r |
|---|---|---|---|---|---|---|---|---|---|---|---|---|---|---|---|---|---|---|
| 1 | 0 | 1 | 0 | 1 | 1 | | | | | | | | | | | | | |
| 2 | | 1 | 0 | 1 | 1 | 0 | | | | | | | | | | | | |
| 3 | | | 0 | 1 | 1 | 0 | 0 | | | | | | | | | | | |
| 4 | | | | 1 | 1 | 0 | 0 | 1 | | | | | | | | | | |
| 5 | | | | | 1 | 0 | 0 | 1 | 0 | | | | | | | | | |
| 6 | | | | | | 0 | 0 | 1 | 0 | 0 | | | | | | | | |
| 7 | | | | | | | 0 | 1 | 0 | 0 | 1 | | | | | | | |
| 8 | | | | | | | | 1 | 0 | 0 | 1 | 1 | | | | | | |
| 9 | | | | | | | | | 0 | 0 | 1 | 1 | 1 | | | | | |
| 0 | | | | | | | | | | 0 | 1 | 1 | 1 | 1 | | | | |
| * | | | | | | | | | | | 1 | 1 | 1 | 1 | 0 | | | |
| # | | | | | | | | | | | | 1 | 1 | 1 | 0 | 1 | | |
| + | | | | | | | | | | | | | 1 | 1 | 0 | 1 | 1 | |
| – | | | | | | | | | | | | | | 1 | 0 | 1 | 1 | 1 |

The light emitters 67, 68, 69, 70, 72 may be positioned in succession on the opposite side of the code bar as indicated in FIG. 47. However, it is also conceivable that all the light emitters 67–71 may be placed on the same side of the code bar whilst the light receivers 67'–71' are placed on the opposite side of the code bar.

It is also conceivable that the light emitters and the light receivers may be activated sequentially to prevent propagation of any scattered light to the wrong light receiver. The sets of light emitters/light receivers can be controlled by a microprocessor 76 which may contain controlling and analysing circuits and circuits for converting the detected binary codes into a unique indication of the correct character. The successive characters which are produced may, e.g., be fed to a display 77 and furthermore external equipment such as, e.g., radio communications equipment, indicated by reference numeral 78, may be provided for communication with the aerial 79, and further communication with a microtelephone or the like. The radio communication unit 78 may, for example, be controlled by a switch 81.

In order to activate the device in the various positions of the code bar relative to the stationary unit 60, an initiating means must be provided such as, e.g., a control key 82 which interacts with the switch 82' or 82", which functions either optoelectronically or electromechanically. As an alternative to such switches 82', 82", it is conceivable that the stationary part 60 may be mounted on a circuit board 83 wherein also the components 67–71, 67'–72', 76 and 77 are mounted, and wherein the circuit board is at one end mounted or hinged via a means 84, and in this way attached to a device base plate 85 or housing, wherein at the other end of the underside of the circuit board 82 there are provided switches, e.g., microswitches. Such switches are indicated by the reference numeral 86 on FIGS. 39 and 47. If the control button is to control a switch such as the switch 82' or 82", a switch of this kind could advantageously be placed on the actual code bar and linked to the microprocessor 76 via wire connection. If wire connections are to be avoided as far as possible, a switch or switches 86 between the base plate 85 or the device housing and a circuit board plate 83 may be an expedient means for reading the binary codes readable at respective times.

Such switches 86 will be common commercial products and only a gentle pressure on the control key 82 will be required to cause the switch to be activated by slight bending of the circuit board plate 83 about the connection 84.

FIG. 48 shows a code bar 87 which is moveable through a detector unit 88, consisting of light emitters 89–92 and light receivers 93–96. The code bar 87 which per se may have approximately the same embodiment as shown in, e.g., FIG. 39 and FIG. 43, can be moved back and forth as indicated by arrow in FIG. 50 by a control means 97. The control means 97 may be an control wheel or a control button. The light emitters and light receivers may, as described in connection with the previous embodiments, e.g., be mounted on a common circuit board, as indicated by the reference numeral 98 on FIG. 49. As was the case for the previous embodiments of the code bar, this code bar also has a plurality of holes 99 which are through-going, so that when a selected hole is on a line between a light emitter and a light receiver, the hole will create a light passage therethrough. In order to better the light passage it is of course conceivable that the individual holes may be provided with an optical light fibre to enhance the passage of light. As for previous embodiments, here too there is a flexible engaging means 100, 101, as indicated in FIG. 49. The engaging means part 101 is adapted against action of a spring to form releasable engagement with markings or recesses in the code bar, e.g., those indicated by means of the reference numeral 102 on FIG. 48 and/or those indicated by the reference numeral 103. Even though the code bar advantageously has a circular cross-section, it will of course be appreciated that it may also a different cross-section, e.g., polygonal.

Instead of a plurality (e.g.) three parallel rows of position-engaging recesses 63 (see FIG. 40) or 103 (FIGS. 48–50), if there is a need to be able to rotate the code bar about its axis 360° or, e.g., through an angle of 30°–90°, it would be inappropriate to have a large number of such parallel, non-coplanar rows of recesses, as they would strongly reduce the number of possible through code holes in the code bar. The recesses or markings which are indicated by the reference numeral 102 on FIGS. 48 and 49 are therefore advantageously located on a free end portion of the code bar. This allows the code bar in fact to rotate stepwise about its axis through 360° or less. In a case of this kind only one row of recesses 63 or 103 is required in the longitudinal direction of the code bar to ensure the stepwise movement in the longitudinal direction of the code bar. Optionally, these recesses or markings may be made into through-going, mutually angularly offset coplanar holes, preferably for use in the detection of the rotational or axial movement of the code bar in connection with an optical detector unit.

FIGS. 51 and 52 show that the control means is able to interact with a light emitter and light receiver pair, indicated by the reference numerals 104 and 105 respectively. As shown in FIG. 51, there is a control means 97, as indicated in FIGS. 48–50, which actuates the movement of a code bar 87 through the detector unit 88. As can be seen, the light emitter/light receiver pair 104, 105 may be mounted on the underside of the circuit board plate 98, although this should of course not be understood as defining the limits of the invention. On a base plate 106, there is an vertical light path barrier 107 which upon depression of the control button 97, as indicated by the downwardly directed arrow on FIG. 52, will cause the light path between the light emitter 104 and the light receiver 105 to be blocked, as shown in FIG. 52. The detector unit 88 is pivotally connected to the base plate 106 via a hinge connection 108. It would be expedient for the detector unit to be elastically depressible towards the base member 106, a feature that can be provided by using a spring device 109, e.g., a disc spring.

In FIG. 53 it will be seen that in connection with the control means 97, coaxial therewith and on each side thereof, is arranged the said code bar 87 and a position-adjusting bar 110 which will be capable of interacting with an engaging means 111, e.g., having a design similar to that of the engaging part 100, 101, as shown in connection with FIGS. 49 and 50. As shown in more detail in FIG. 54, both the code bar 87 and the position-adjusting bar 110 are slidably supported in a housing body 112, whereby both axial movement and rotating or tilting movement of the bars 87 and 110 can be provided. There may be a base plate, such as, e.g., the base plate 106, in this figure indicated by the reference numeral 106" The housing 112 may be connected to the base plate 106' via a hinge connection, in this figure designated by the reference numeral 108'. A spring unit, like the spring 109 in FIG. 51, is also provided in the solution shown in FIG. 54 and is denoted by the reference numeral 109'. As indicated by means of the reference numeral 113, the bar member 110 may optionally be made in the form of a secondary code bar with through holes, so that the passage of light through such holes can be effected by a light emitter unit 114 which will interact with a light receiving unit 115. This allows additional coding possibilities to be obtained in connection with the device. The engaging means 111 can interact with, for example, hole 111', as shown and explained in a similar manner in connection with FIGS. 48–50, and the preceding figures, in particular FIGS. 40, 41 and 42.

The light emitter unit 114 may, for example, consist of a sixth and seventh set of light emitter/light receiving pairs, indicated by the reference numerals 116, 117 and 118, 119 respectively. In addition, in connection with the light emitter unit 114 and the light emitter unit 115 which form the secondary optical detector unit, there could be an eighth, a ninth and a tenth set of light emitter/light receiving pairs, indicated by means of the reference numerals 120, 121; 122, 123; 124, 125, respectively.

As shown in FIGS. 55 and 56, the control means consists of a cup-shaped button, indicated here by the reference numeral 126. In this case for the sake of simplicity the code bar is designated by the reference numeral 127 and interacts with a light emitter unit consisting of light emitters 128, 129, 130 and 131 with associated light receivers 132, 133, 134 and 135. Through holes, indicated here by the reference numeral 136, are provided in the code bar. On the internal periphery of the control button 126 there are provided means, e.g., recesses 137 which engage with an elastic device 138, resulting in a flexible, releasable position engagement with an external portion of a housing body 139 belonging to the device. As shown, the code bar 127 is fastened coaxially to the control button, e.g., by means of a pin 127' which forms threaded engagement with a fixing screw or the like, indicated by the reference numeral 140. It is thus possible to make the device itself axially more compact.

FIG. 57 shows yet another modification of the device according to the invention. In this case the control means consists of an endless belt 141 which is passed over two opposing rotating rollers 142 and 143. The outer side of the belt is, as shown in FIG. 57 by the arrow 144, in frictional engagement with a code bar 145 for rotating the code bar when the belt is moved in the direction indicated by the arrows 146. The code bar may be made conventionally with through holes 147, and it will be appreciated that the number of holes will of course be highly variable, according to requirements. For instance, four or more through holes 147 may be provided, as indicated in FIGS. **58*a* and 58*b*. The belt 141 may optionally be provided on its inner side with transverse ribs 148 for better engagement with the rollers 142 and 143. A step mechanism 150 located on the roller 142 support may, e.g., form successive, releasable engagement with indentations 151 on the surface of the roller 142. If said indentations consist of axial, parallel grooves on the surface of the roller 142, the ribs 148 can, e.g., be spaced apart so that the ribs engage with the grooves when the roller 142** is made to rotate, thereby counteracting any slipping of the belt.

Preferably, the rotating rollers 142 and 143 will be mutually spring-tensioned. A spring tensioning of this kind is shown schematically by the reference numeral 149. In order to be able to maintain the tension of the belt 141 by means of the spring tensioning 149, it is necessary that one of the rollers be hinge-connected to the cradle 160, e.g., at a hinging point 174.

Located on opposite sides of the code bar, which is axially immobile, but rotatable, are light emitters and light receivers respectively, in FIG. 57 indicated by means of the reference numerals 152 and 153 and the same in FIG. 58, but it will be appreciated that several light emitters and light receivers could be provided for the detection of the passage of light transverse to the code bar 145, as when using additional light emitters 154, 155, 156 and associated light receivers 157, 158, 159 as indicated in FIG. **58*b***.

The code bar 145 and the rotating rollers 142, 143 are pivotally supported in the cradle 160. The cradle 160 can be tilted to both sides about tilt axis 164 as indicated by the arrows 161 and 162, or pushed downwards as indicated by the arrow 163 at an end portion 165 of the cradle.

The end portion 165 has lugs 166 and 167 projecting from the cradle 160. Two motion detectors are provided for interacting with respective lug 166, 167 to cause a light path in each detector pair on the tilting motion of the cradle to one side or the other, as indicated by the reference numeral 161 or 162, or a downward movement as indicated by the reference numeral 163. The detector pairs are indicated by means of the reference numerals 168, 169 and 170, 171 and designate respectively the light emitter and the light receiver in the pair.

In the solution shown in FIGS. 57 and 58, it is not just detection of coded holes in the code bar 145 that is provided, but in addition tilting motions of the cradle and possible downward movement, e.g., to effect a reading of that intercepted one or more of the light receivers 153, 157–159. A spring mechanism, indicated by the reference numeral 172, may optionally be provided for a sprung movement of the cradle relative to a base 173. The cradle will be capable of being tilted about its axis 164, and thus movable relative to the base 173. The support of the cradle on the axially opposite side of the end portion 165 may, for example, take place via a swivel, e.g., of the type shown on the right in FIGS. 59 and 61.

The said pivot point has not been shown on FIG. 57 for drawing-technical reasons, but a person versed in the art will appreciate immediately how the support could take place.

The solution shown in FIG. 80 employs a belt 268 running over a roller pair 269, 270. The roller 270 has a plurality of spaced, parallel and axially extending holes 271. A light emitter 272 and a light receiver 273 are located at the respective end of the roller 270 and form a detector for detecting rotation of the roller. Upon rotation of the roller, detection of sequential light reception as the holes 271 pass, can e.g., cyclically control a register 274 for fetching desired parameters which can be transmitted to a microprocessor 275 which is adapted to control peripheral equipment 276. The rollers 269 and 270 together with their belt 268 are mounted on a cradle 277 which at a free end thereof has projecting lugs 278 and 279 which actuate the light path between respective light emitter and light receiver 280, 281 and 282, 283 in these detectors when the cradle 277 either is tilted to one side or the other or is pushed downwards at its end portion 277'.

FIGS. 81–85 show two rollers 285 and 286 which are surrounded by and can be rotated by a belt 284. The rollers are mounted in a cradle 287 which can be tilted or depressed relative to a cradle support 289 which is located on a base 292. The roller 286 is of the same type as the roller 270. Detector pair 293, 294 detects successive passages of light through holes 286' in the roller 286 when this rotates. The device has a belt support and a pressure plate 288 which with a channel 290 that is approximately oval in vertical section form pivotal connection with a shaft 289 arranged in the cradle support 289. The plate 288 is supported by a spring 291. The cradle 287 can be tilted to one side or the other, as shown in FIG. 87. By pressing straight down on the belt 284 and thus on the plate 288 too, the cradle can also be moved vertically. The movements are thus the same, in terms of function, as those shown and described in connection with FIG. 80, but also as indicated in connection with FIG. 57. Detectors 295 and 296 detect tilting motion of the cradle to one side or the other relative to the cradle 287. Upon depression of the cradle both detectors 295 and 296 will be activated. Tilting or depression of the cradle is carried out against the action of the spring 291, so as to ensure the movement will be felt distinctly In other respects the embodiment is the same in terms of function as that shown and described in connection with FIG. 80.

A further embodiment of the invention will now be described with reference to FIGS. 59–63.

In this embodiment there is a cradle 175 which is tiltably supported, e.g., via a ball pivot 176 in an apparatus housing 177. The cradle can be tilted about its longitudinal axis 178, but will also be tiltable relative to its longitudinal axis, as indicated by the reference numeral 178'. An optically readable code wheel 179 is pivotally supported in the cradle 175. Preferably, the rotatory motion takes place in that an inner portion 180 of the wheel 179 has a number of recesses 181 located on an inner wall of the wheel 179. These recesses 181 interact with preferably spring-loaded balls 182 which may optionally be spring-tensioned by a spring 183. The spring device 183 is preferably fixed in the cradle, as can be seen clearly in FIG. 61, so that the support of the wheel 179 in fact effected via the preferably spring-loaded balls. Since the sides of the cradle also provide lateral stability for the wheel in the cradle itself, it will be understood that the outlined support of the wheel 179 will be sufficient. The code wheel 179 may be provided with code section 184 as shown in FIG. 63, and a first detector, consisting of a light emitter 185 and a light receiver 186, detects the markings on the wheel, said markings preferably being transparent. The first optical detector 185, 186 is expediently positioned on a component plate 187 which is stationary relative to the cradle. The optically readable code wheel 179 thus has code section 184 which may consist of at least one set of transparent and non-transparent sector portions, wherein the set covers a sector angle in the range of 1°–360°. Preferably, two or more sets of such sector portions are provided, wherein the sets can be arranged concentrically and each one spans a sector angle in the range of 1°–360°. Each sector may have radially differently located transparent and non-transparent sections, each such sector providing a specific optical code. The said first optical detector has on the light receiver side a connection to a step counter 188 whereby the rotation of the wheel cyclically can effect a search in a register 189 containing characters, symbols or the like, so that such characters, symbols or the like can be output on a display 190 and in addition used by a processor 191, e.g., in connection with transmitter-receiver equipment 192 in a mobile phone, as indicated in FIG. 62. However, this must by no means be understood as defining the limits of the use of the invention.

In addition, the cradle 175 has two laterally arranged lugs 193 and 194 which interact with second and third detectors, consisting of respectively light emitter 195, light detector 196 and light emitter 197, light receiver 198.

When the cradle 175 is thus caused to tilt about its longitudinal axis 178, the light path for either the second detector 195, 196 or the third detector 197, 198 will be actuated. The light receiver, such as, e.g., the light receiver 198, will thus be capable of being connected to the microprocessor 191. In addition to being tiltable sideways, as can be seen clearly from, e.g., FIGS. 60 and 61, but also from FIG. 63, it will be expedient to support the cradle at one end thereof opposite the ball pivot 176 in a sprung manner. In the illustrated example, it is envisaged that a disc spring 199 will be used. When the cradle 175 is pressed downwards, so that its end portion 175' moves downwards, the cradle will rotate about the ball pivot 176 and with its longitudinal axis take up a position which is represented by the downwardly sloping axis 178'. Of course, in such a situation, the light paths for both said second detector and said third detector, 195, 196 and 197, 198 respectively, will be actuated so that in fact three signalling possibilities will be provided by the sideways tilting of the cradle and the depression of the end portion thereof. However, a person versed in the art will understand that by means of modifications, the number of possible positions for the cradle and thus also the signalling possibilities for can be smaller or greater, without thereby departing from the inventive idea.

The wheel 179 can, e.g., be designed as shown in FIG. 89 and indicated by the reference numeral 297. A plurality of holes 298 is provided, preferably evenly spaced apart, are provided in the wheel 297. By using, e.g., a light emitter 299 and two light receivers 300 and 301, greater detection possibilities are obtained than with only one light emitter 185 and one light receiver 186, the detection being as indicated in FIG. 90, wherein CW stands for clockwise rotation and CCW stands for counter clockwise rotation. In particular the junction between wall and hole will be detected accurately, no matter which rotational direction the wheel is turned in. FIG. 91 shows in more detail what happens when the cradle 175, here only indicated schematically, is either kept still, depressed at the detector 195, 196, depressed at the detector 197, 198 or straight down in the middle above the spring 199. C and D designate light receiver 196 and 198 respectively.

This solution is advantageous in that it can serve many functions, and at the same time it eliminates many press buttons and allows, e.g., a large display to be made on an otherwise small apparatus housing, as is known from mobile phone technology. The device is easy to operate and has a simple mechanical structure with few moving parts. It is inexpensive to produce and can be made relatively small. It is also barely subject to wear. However, it is somewhat less robust as regards water and dust.

Yet another embodiment of the present invention can now been seen from FIGS. 64–70 with a variant thereof illustrated in FIGS. 71 and 72. In this embodiment there is an apparatus housing 200 in which a control wheel 201 is pivotally arranged. The control wheel has a plurality of radially positioned angularly offset through holes 202. On at least three portions thereof the control wheel is spring-supported, e.g., by using so-called disc springs 203. At least one light emitter 204 and light receiver 205 set is placed on opposite sides of the control wheel. In FIG. 65 it is indicated that there could be a plurality of light emitters and light receivers, designated respectively by the reference numerals 206–210 and 211–215. As indicated in FIG. 66, it would be possible for instance, if, e.g., four springs 203 were provided, to tilt the control wheel about the axis dbe or abc, or ad, cd, ce or ae, as well as there being the possibility of pressing the wheel straight down at point B. Although in FIG. 64 only one light emitter 204 and one light receiver 205 is shown, it will be appreciated that a plurality of light emitters and light receivers may be provided, as shown in FIG. 65. Like the embodiment in FIGS. 59–63, it will be expedient to connect, e.g., the light receiver 205 to both a counting circuit 188 and a microprocessor 191, not only to count the individual movement steps, but also to detect a light path between light emitter 204 and light receiver 205. By, for example, tilting the control wheel 201 as shown in FIG. 61, the light path between the light emitter 204 and the light receiver 205 will be so actuated that it is perceived as a non-existent light signal by the light receiver 205. In FIG. 68 the control wheel has been pressed downwards at, for example, point B, thereby depressing all the springs 203.

The wheel 201 is preferably flexibly supported by a support 216, as indicated in FIG. 68. In the solution shown in FIGS. 71 and 72 it is envisaged that that only a single light emitter 217 can be used which via light channels 218 communicates with a plurality of light receivers 219–232, as proposed as a non-limiting example of the invention in FIG. 71. The output from the light receivers may, e.g., be fed to a microprocessor 233 which is further connected to peripheral equipment 234. Besides detecting the motion of the wheel 201, the microprocessor 233 may also, e.g., cyclically search the output from all the light receivers to see which are active as regards reception or non-reception of light. The peripheral equipment 234 may, e.g., be a display device. Optionally, the microprocessor 233 may be connected to a radio transmitter and receiver 235 which has aerial equipment and optional equipment for emission and reception of sound.

FIGS. 73–79 show yet another embodiment of the device according to the invention. In this case too there is an apparatus housing, indicated here by the reference numeral 236, in which a control wheel 237 is arranged, wherein the control wheel is spring-supported by a spring 238 at least at three portions thereof. A top view of the wheel 237 is presented in FIG. 77. The wheel may be provided with a slightly depressed portion 239, to allow a finger to turn the wheel easily to one side or the other. The housing 236 has an edged recess 240 in which the wheel 237 can be partially recessed. In this recessed portion there are, e.g., three elevations 241, 242 and 243 which form tilt points for the wheel. The wheel has a downward projecting pin 244 which is to form pivotal engagement with a fixing bracket device 245, the pin 244 designed to fit into a hole 246 in the fixing bracket device 245. The fixing bracket device 245 may either be provided with a bearing (not illustrated) which allows the pin 244 and so the wheel 237 to turn relative to the fixing bracket device. Alternatively, the pin 244 may be provided at the bottom with a snap-in device, so that it snaps into place and cannot be pulled up, but nevertheless is rotatable relative to the fixing bracket device. As an additional alternative, the pin may consists of two parts with a dividing area 244', optionally that the pin 244 is whole, but with the wheel 237 itself either snapped on or secured by a screw to the pin 234 and in such a manner that the wheel is rotatable relative to the pin. FIG. 73*c* shows the fixing bracket device from the side and FIG. 79 shows the fixing bracket device from above. The fixing bracket device has openings 247, 248 and 249 to allow optical markings 264 on the underside of the wheel to be detected. The optical markings are designated generally by the reference numeral 250, and it should be understood that, e.g., two or more concentric sections of such markings may be used. Thus, the section 263 could be just such a supplementary area of markings.

The fixing bracket device 245 has, e.g., three hook-shaped lugs 251, 252 and 253 which engage with cut-outs 265 in a bead 254 on the housing 236, see inter alia FIGS. 92 and 93. The fixing bracket device 245 may be equipped with, e.g., a step spring 245' which with its free end forms stepwise engagement with the annular section 263 of grooves on the underside of the wheel 237. The provision of tilt points 241–243 allows the wheel 237 to be tilted about the points 241 and 243, 241 and 241 or 242, 243. Owing to the design of the fixing bracket device, it will be possible, as can be seen in FIG. 75, to detect with the aid of a respective detector pair, as indicated by the reference numerals 255, 256 and 257, tilting of the wheel about the points 241, 243 or 241, 242 or 242, 243. The detectors 255, 256 and 257 consist of respective light emitters and light receivers indicated by the reference numerals 255', 255", 256', 256" and 257', 257". If it is assumed, as is referred to in FIG. 75, that it is the detector 257 which is to start functioning when the wheel is tilted, it will be seen that when the wheel tilts towards the abutment of the spring 238, the lug 253 will move downwards slightly relative to the bead (see FIGS. 94 and 95), but still remain in its respective cut-out 265, like the two other lugs. This means that the light path between light emitter 257' and light receiver 257" is bound to be actuated so that light is made to pass via a hole 266 in the bracket device and a hole 267 in said bead 254.

As indicated in FIG. 74, for example, the light emitter 256' and the light receiver 256" may be connected to a microprocessor 258 which in turn can be connected to peripheral equipment, such as, e.g., a display device 259. Furthermore, the microprocessor 258 can be connected to transmitter-receiver equipment 260, optionally with associated equipment for emission and reception of sound. As will be seen from FIG. 73, at least one detector 261 is provided for detecting the rotatory motion of the control wheel, this detector of course also being connected to the microprocessor 258. In addition, it would serve to provide a further detector 262 for reading the optical markings 264 on the underside of the wheel 237. Of course, it is possible that the detector 216 could also read these markings as a supplement to the readings that the detector 262 will be able to take.

Although it is not shown in FIG. 74, it will be understood that the other light emitters and light receivers will of course be connected to the microprocessor 258. For the sake of clarity, such connection to the microprocessor 258 has not been indicated. The optically readable code wheel will preferably be provided with at least one set of marked and non-marked sector portions, wherein such a set will cover a sector angle in the range of 1°–360°. Of course, two or more such sector portions, which are concentric and wherein each spans a sector angle in the range 1°–360°, can be provided. By way of example FIG. 76 shows two such readable sector portions 263 and 264 which are concentric and wherein each span a sector angle in the range 1°–360°, although this should not be understood as defining the limits of the invention.

FIG. 96 shows the rotation of the wheel 237 in clockwise direction and how, for example, a detector 261 or 262 is capable of giving a binary out-signal depending upon the step-by-step position of the wheel. CW denotes rotation in the clockwise direction, whilst CCW denotes anticlockwise rotation.

In FIG. 97 it is shown how tilting or depressing the wheel 237 and thus also the bracket device 245 can take place at points C, D and E and thus actuate respective detector 255, 256 and 257, cf. also FIGS. 74 and 78.

| Detector --------------------> | 255 | 256 | 257 |
|---|---|---|---|
| No depression of wheel 237 | 0 | 0 | 0 |
| Depression at C | 1 | 0 | 0 |
| Depression at D | 0 | 1 | 0 |
| Depression at E | 0 | 0 | 1 |
| Depression at centre of wheel 237 | 1 | 1 | 1 |

The advantage of this solution is that many functions can be maintained, whilst a great number of push buttons are eliminated. It will be easy to operate, is simple and robust in construction (few parts), inexpensive to manufacture and can be made very slim. However, it will require a certain surface, e.g., about 20 mm in diameter.

FIGS. 98–103 show a control wheel 302 with a depression 303 for engagement with a finger. The wheel 302 is supported by a cradle 304 which is tiltable but not rotatable about its axis relative to the device housing 305. The wheel 302 has a shaft 306 which is passed through the cradle 304 with clearance via a hole 307 therein, and is spring-mounted relative to a base plate 308 by means of a spring 310 and a bracket device 309.

The cradle has a subframe 311 which is supported by three tilting pads 321–314. The wheel 302 has on the underside thereof a code section 315 and a step engaging section 316, e.g., a belt of closely spaced recesses which form successive engagement with support and step controlling bosses 317–319. Detectors 320–322 are provided on the base plate for detecting the code section 315 via openings 323–325 in the cradle when the control wheel is turned stepwise. The detectors 320–322 are optoelectrical, whilst the detectors 326–328 for detecting the tilting motion of the cradle about a pair of pads 312–313, 313–314 or 314–312 consist preferably of microswitches. Both the optoelectrical and the mechanical switches can be connected to a microprocessor 329 (for the sake of simplicity only two of these are shown connected), which can be further connected to optional peripheral equipment 329'.

FIGS. 104–115 show a solution which basically works in the same way as that just explained in connection with FIGS. 98–103. FIGS. 104–115 show a control wheel 330 having a depression 331 for engagement with a finger. The wheel 330 is supported by a cradle 332 which is tiltable but not rotatable about its axis relative to the device housing 333. The wheel 330 has a shaft 334 which is passed through the cradle 332 via a hole 335 therein, and is secured pivotally to the cradle. The cradle has a subframe consisting of three curved tilting pads 336–338. On the underside thereof the wheel 302 has a code section 339 and a step engaging section 340, e.g., a belt of closely spaced recesses which form successive engagement with support and step controlling bosses 341–343. Detectors 344–346 are provided on the base plate for detecting the code section 339 via openings 347–349 in the cradle when the control wheel 330 is turned stepwise. The detectors 344–346 are optoelectrical, like the detectors 350–352 for detecting the downward tilting motion of the cradle towards a respective one of the detectors 350–352. At three extreme points, the cradle is connected via pins 353–355 to guides 358 (only one is shown in FIG. 110) in the housing to ensure that the tilting motion of the cradle is controlled at all times. In this respect the solution is somewhat reminiscent of that shown in FIGS. 92–95. The optoelectrical detectors 344–346 and 350–352 can be connected to a microprocessor 356 (for the sake of simplicity only two of these are shown connected), which can be further connected to optional peripheral equipment 356'.

On the underside of the cradle there is a spring 357 and a connecting pad 359 between the cradle 332 and the spring 357. Three pins 360–362 also extend down from the underside of the cradle which serve in a tilting action as motion stoppers and light passage inhibitors.

The solution in FIGS. 116–123 has many features in common with the solution shown in FIGS. 104–115. A control wheel 363 having a depression 363' for engagement with a finger is shown. The wheel 363 is supported by a cradle 364 which is arranged to be tiltable but not rotatable about its axis relative to the device housing 365. The wheel 363 has a shaft 366 which is passed through the cradle 334 via a hole 367 therein, and is secured so as to be pivotal relative to the cradle, but terminated on the underside of a housing 365 base 368 against tensioning from a spring 369, e.g., a disc spring or coil spring. The cradle has a subframe consisting of three curved tilting pads 370–372. The wheel 363 has on the underside thereof a code section 373 and a step engaging section 374, e.g., a belt of closely spaced recesses which form successive engagement with support and step controlling bosses 374–376 located on the surface of the cradle. Detectors 377–379 are provided on the base plate for detecting the code section 373 via openings 380–382 in the cradle when the control wheel 363 is rotated stepwise. The detectors 377–379 are optoelectrical, like the detectors 383–385 for detecting the downward tilting motion of the cradle towards a respective one of the detectors 383–385. At three extreme points, the cradle 364 is connected via pins 386–389 to guides, like the guide 358 in the housing, as shown e.g., in FIG. 110, to ensure that the tilting motion of the cradle is controlled at all times. In this respect the solution is somewhat reminiscent of shown in FIGS. 92–95. The optoelectrical detectors 377–379 and 383–385 can be connected to a microprocessor 389 (for the sake of simplicity only two of these are shown connected), which can be further connected to optional peripheral equipment 389'.

To limit the tilting of the cradle there are preferably provided motion limiting pins, as shown in FIGS. 114 and 115, which extend down from the underside of the cradle at the end of the pads 370–372, and are indicated by the reference numerals 390–392.

As shown in FIGS. 124–128 the device comprises a rotatable drum 393 which is rotatable about its longitudinal axis. The drum is rotatably attached to a cradle 394 via hub means 395. The cradle 394 and thus the drum 393 can be tilted at either end or pushed down at a mid region thereof against the force of a spring 396 located on housing 397. The cradle 394 is tiltable about an axle 398 which is located in an oblong guide 399 of the cradle 394, thus enabling both tilting and push-down of the cradle 394. The drum 393 has a plurality of longitudinally extending, through-going, parallel bores 400. A first pair of light emitter 401 and light receiver 402 assists in detection of rotary position and rotation as such of the drum 393 by emitting light through successive of said bores 400 as the drum 393 rotates and receiving light at the other end. As regards function, reference is given to the structure described in connection with FIGS. 80–87. A second pair of light emitter 403 and light receiver 404 is located at one end for the drum. A third pair of light emitter 405 and light receiver 406 is located at the other end of said drum. Down-tilting of the cradle and drum at said one end will inhibit light passing from the emitter 403 to the receiver 404 due to a cradle piece 407 blocking the light path therebetween. Down-tilting of the cradle and drum at said other end will inhibit light passing from the emitter 405 to the receiver 406 due to a cradle piece 408 blocking the light path therebetween. If both the drum and the cradle are pushed down at the mid region thereof, light passage at both said one end and said other end will be inhibited.

As shown in FIGS. 129–133 the device comprises a rotatable drum 409 which is rotatable about its longitudinal axis. On the inner wall of the drum there provided light reflective stripes 410 and non-reflective stripes 410'. The drum is rotatably attached to a cradle 411 via hub means 412. The cradle 411 and thus the drum 409 can be tilted at either end or pushed down at a mid region thereof against either the force of a spring 413 located on housing 414 or against spring force provided by electrical push-type switches 415 and 416 located at respective ends of the drum 409. The cradle 411 is tiltable about an axle 417 which is located in an oblong guide 418 of the cradle 394, thus enabling both tilting and push-down of the cradle 411. A first unit 419 of light emitter and light receiver assists in detection of rotary position and rotation as such of the drum 409 by emitting light towards successive of said stripes 410, 410' as the drum 409 rotates. A first electrical push-down type micro-switch 415 is located at one end for the drum. A second electrical push-down type micro-switch 416 is located at the other end of said drum. Down-tilting of the cradle and drum at said one end will operate switch 415, and down-tilting of the cradle and drum at said other end will operate switch 416. If both the drum and the cradle are pushed down at the mid region thereof, bith micro-switches 415 and 416 will operate.

The device of FIGS. 134–138 as well as FIGS. 139–144 is particularly useful for navigating through large operation menues and documents or a large number of pages, e.g. on Internet, as well as on electronic apparatus such as e.g. cellular phones. The switch device combines a four-point switch (center switch) 421, 433–436, 437–440 with a wheel 422 which is rotatable and in addition has four push-down points 427–430 for operating switches thereat. However, the invention is in no way limited to the use of four push-down points, and should as such be construed as an example only for the purpose of explaning the invention. Thus the present device will be capable of unlimited rotation, n push-down points 427–430 on the wheel 422 and m push-down points 423–426 on the center button or switch 421 of the device, yielding a total of n+m push-down points plus rotation. Suitably n=m=4, although there is the possibility of n and m having other values and n≠m. The center button 421 has a hole 431 in which an axle 432 is located, so that the button 421 is tiltable about the axle 432. It will, however be noticed that the hole 431 at either mouth thereof is oblong in a vertical direction and substantially circular at its centre. This structure enables four-way tilting of the button 421, parallel to the hole of substantially X-cross section (points 424 and 426) and about the axle 432 (points 423 and 425). The button 421 is kept in neutral position by spring force provided by push-down type micro-switches 433, 434, 435 and 436 which engage a four arms 437, 438, 439 and 440, respectively extending out from a bottom region of button 421. Pushing down at 423 will thereby via a respective one of said arms operate switch 433, at 425 switch 434, at 424 switch 435 and at 426 switch 436.

The button 421 with its four switch possibilities is located in the center of the wheel 422. The wheel 422 has unlimited possibility of rotation. The bottom side of the wheel 422 has a plurality of light reflective sectors 441 and light non-reflective sectors 442, as clearly seen on FIG. 142. Further, in order to be able to rotate the wheel 422 in steps, there is along the periphery thereof a plurality of V or U shaped grooves 443, said grooves 443 through rotation of the wheel successively engaging at least one groove engaging spring means 444. The bottom side of the wheel 422 having said sectors 441 and 442 is illuminated by a pair of light emitting and receiving units 445 and 446. Thus, the stepwise rotation of the wheel 422 can be detected in a manner similar to that described in connection with e.g. the embodiment of FIGS. 98–103. The wheel 422 rides on a platform 447' of a frame 447, and the platform has two openings 448 and 449 through which said sectors are viewable by said units 445 and 446. The wheel 422 is able to act at the push-down points or locations 427–430 on corresponding micro-switches 450–453 in view of the frame 447 resting on these micro-switches. The axle 432 is supported by a pair posts 454 located on the device base 455.

The elements which are common to the embodiments of FIGS. 134–138 and 139–144 are denoted by same reference numerals. The arms 460–463 of FIGS. 139, 140 and 144 have a somewhat different configuration than the corresponding arms of FIGS. 135–137. The micro-switches 433–436 have been replaced by sets 456, 456'; 457, 457'; 458, 458' and 459, 459' of light emitter/receiver with light emission aperture means 456", 457", 458" and 459", respectively to create a narrow light beam towards a corresponding light receiver. The arms 460–463, as the button 422 is pressed down at a respective one of the locations 423–426 will with a portion thereof inhibit light from passing between light emitter and receiver of a corresponding set thereof. A cup shaped spring 464 resting between base 455 and the bottom of button 421 provides the required neutral mid-position of button 421 when no tilting/pressing-down action is made. Further, upon tilting action, the spring may provide a motion indication. The device has a top plate 465 as indicated on FIGS. 135, 136, 139, 140 and 141.

Further, in order to prevent tilting of the wheel 422 between the allocated tilting positions, tilt inhibitors 466, 467, 468, 469 are provided.

Although locations 423, 427; 424, 428; 425, 429; and 426, 430 are aligned, respectively, it may be of advantage to avoid such alignment, e.g. by shifting the the-positions 427–430 45°.

All of the embodiments provide a device that is easy to operate, even with one hand, and a large number of control buttons are avoided. The devices allow three-dimensional movement together with the parts of which the device is composed, i.e., movement in the x, y and z plane.

Although in several connections reference is made to optoelectronic detectors consisting of a light emitter and a light receiver, it will be appreciated that in certain applications it is possible to replace these wholly or partly with detectors or switches which are mechanical, capacitive or inductive, without thereby departing from the inventive idea.

Although the drawings show preferred embodiments of the device according to the invention, it will be appreciated immediately that it is possible to vary both component design and position of same within the scope set forth in the attached patent claims.

What is claimed is:

1. A keypad device for telephones, mobile phones, remote control units, text and character transmitters, calculators, electronic planners or the like, wherein a control element, when actuated manually by an operator, is adapted to be able to carry out at least two function commands, and wherein various positions of the control element are identified by means of optical detectors, characterized by

- a code bar (61; 72; 145) movable through at least one of slide motion and rotation;
- a detector unit (60) having a through, longitudinal channel (62) for moving the slide member (61; 72) stepwise through the detector unit (60);
- at least a first and a second set of light emitter/light receiver pairs (67, 67'; 68, 68'; 69, 69'; 70, 70'; 71, 71') arranged in the detector unit for light emission and detection of received light transverse to the channel;
- transverse holes (75, 75', 75") arranged in the longitudinal direction of the code bar and spaced apart at regular intervals;

a control means (82) interactive with the code bar, said control means on actuation thereof to effect registration of which of the transverse holes light passes through or light is blocked from passing through, as detected by aid of said at least two sets of light emitter/light receiver pairs.

2. A keypad device according to claim 1, characterized by said control means (82) being either located on the slide member (61; 72) or said control means (66; 104, 105, 107) being cooperative with the detector unit (60; 88) and actuable upon tilting of the detector unit (60; 88) against spring force (109).

3. A device as disclosed in claim 1 or 2, characterized in that in addition to the said first and second set of light emitter/light receiver pairs there is arranged a third and a fourth set of light emitter/light receiver pairs (116, 118, 120, 122, 117, 119, 121, 123).

4. A device as disclosed in claim 1 or 2, characterized in that the sets of light emitters/light receivers are located on a common circuit board (98), and wherein stepwise mechanical movement of the slide member (87) relative to the detector unit causes passage of light through holes (99) in the code bar and to a respective light receiver; and that the array of light receivers registers on respective light receivers reception or non-reception of light, whereby output from the light receivers is converted to respective sets of binary <<1>> and <<0>> characters.

5. A device as disclosed in claim 1 or 2, characterized in that a stationary part of the device is equipped with flexible engaging means (100, 101; 111) for releasable engagement with markings (103; 111') or recesses on the code bar for stepwise displacement and positioning of the code bar relative to the stationary part.

6. A device as disclosed in claim 1 or 2, characterized in that the code bar (61; 72) has a cross-section which is essentially circular or essentially polygonal, e.g., hexagonal.

7. A device as disclosed in claim 2 or 3 characterized in that the said holes pass through and transverse to the longitudinal central axis of the code bar.

8. A device as disclosed in claim 1 or 2, characterized in that in the longitudinal direction of the code bar there are arranged at least two sets of mutually positioned holes; and that at least two sets of holes pass through and transverse to the central axis of the code bar at an angle to one another.

9. A device as disclosed in claim 8, characterized in that the said angle is in the range of 0°–360°, preferably 5°–90°.

10. A device as disclosed in claim 8, characterized in that at least two sets of holes (66; 66'; 66"; 75; 75'; 75") are provided which pass through the code bar at an angle to one another.

11. A device as disclosed in claim 8, characterized in that the holes in one set lie in a transverse plane on the code bar which is different for holes in other sets of holes.

12. A device as disclosed in claim 8, characterized in that at least one set of holes in a first set lies in the same plane as one of the holes in a second set.

13. A device as disclosed in claim 1 or 2, characterized in that the light emitters and light receivers are connected to a microprocessor (76), and that the microprocessor is connected to at least one display device (77).

14. A device as disclosed in claim 13, characterized in that the microprocessor (75) is connected to a radio transmitter and receiver (78); and that the radio transmitter and receiver is connected to aerial equipment (79) and equipment for emission and reception of sound (80).

15. A device as disclosed in claim 1, characterized in that the control means (97) interacts with a mechanical switch (82").

16. A device as disclosed in claim 1, characterized in that the control means (82') interacts with a light emitter/light receiver pair.

17. A device as disclosed in claim 1, characterized in that depression of the control means (97) actuates a switch means (104, 105) located between a device base plate or housing body and an associated circuit board plate upon which the detector unit/units is/are mounted.

18. A device as disclosed in claim 2, characterized in that the control means (141–143) consists of an endless belt (141) which is passed over two opposing rotating rollers (142, 143), and wherein the outer side or the inner side of the belt is in frictional engagement with the code bar for rotating the code bar (145) on movement of the belt.

19. A device as disclosed in claim 18, characterized in that the belt is by means of a step mechanism (150) adapted to stepwise rotation and position adjustment of the code bar.

20. A device as disclosed in claim 18 characterized in that the rotating rollers are spring-tensioned (149).

21. A device as disclosed in claim 18, characterized in that the code bar (145) and the rotating rollers (142, 143) are pivotally supported in a cradle (160), that the cradle is tiltable to both sides or capable of being depressed at the end portion thereof, that the end portion has lugs (166, 167) projecting from the cradle (160), arid that two cradle motion detectors (168, 169; 170, 171) interact with a respective lug of said lugs (166, 167) so as to actuate, upon tilting motion or downward motion of the cradle, a light path between a light emitter and a light receiver in each detector pair.

22. A device as disclosed in claim 1, characterized in that depression of the control means actuates via downward motion of a device housing body a switch means (86) which is positioned between the housing body and a base element upon which the housing body is pivotally and spring-mounted.

23. A device as disclosed in claim 1, characterized in that the control means is a wheel (97) or a key (82).

24. A device as disclosed in claim 1, characterized in that the control means is a, preferably cup-shaped, control button (126), wherein the internal circumference of the button surrounds an associated portion of a housing body belonging to the device and is made having a means (137, 138) which on displacement of the control button in its axial direction or rotatable directions is intended to form elastic, releasable position engagement with an external portion of a device housing body, and that the code bar (127) is secured to the control button coaxially therewith.

25. A device as disclosed in 1 characterized in that at a free end portion of the code bar there is positioned a plurality of through-going, mutually angularly offset coplanar holes (102), preferably for use in detection of the rotational or axial motion of the code bar.

26. A device as disclosed in claim 1, characterized in that in connection with the control means (97), coaxial therewith and on each side thereof, there is provided a code bar (87; 110) and a position-adjusting bar (110) respectively which are both slidably supported in a device housing body for providing axial motion and rotational motion of the bars.

27. A device as disclosed in claim 26, characterized in that the position adjusting bar (110) in addition is designed as a secondary code bar, and that a secondary optical detector unit (114, 115) is mounted in the housing body and adapted to detect the movements of the secondary code bar (110).

28. A device as disclosed in claim 26 characterized in that the secondary optical detector unit (114, 115) consists of at least a sixth and seventh set of light emitter/light receiver pairs (116, 117; 118, 119).

29. A device as disclosed in claim 28, characterized in that the secondary optical detector unit also has an eighth and ninth set of light emitter/light receiver pairs (120, 121; 122, 123).

30. A device according to claim 2, characterized in that movement of the control element can be felt manually.

31. A device according to claim 2, characterized in that movement of the control element is indicatable by sound, light or display or any combination thereof.

32. A device according to claim 3, further characterized in a fifth set of light emitter/light receiver pairs (124; 125).

33. A device according to claim 28, characterized in at least a further, tenth set (124, 125) of light emitter/light receiver pairs.

* * * * *